US009595670B1

(12) United States Patent
Gee et al.

(10) Patent No.: US 9,595,670 B1
(45) Date of Patent: Mar. 14, 2017

(54) RESISTIVE RANDOM ACCESS MEMORY (RRAM) CELL AND METHOD FOR FORMING THE RRAM CELL

(71) Applicant: Crossbar, Inc., Santa Clara, CA (US)

(72) Inventors: Harry Yue Gee, Milpitas, CA (US); Steven Patrick Maxwell, Sunnyvale, CA (US); Natividad Vasquez, Jr., San Francisco, CA (US); Sundar Narayanan, Cupertino, CA (US)

(73) Assignee: CROSSBAR, INC., Santa Clara, CA (US)

( * ) Notice: Subject to any disclaimer, the term of this patent is extended or adjusted under 35 U.S.C. 154(b) by 88 days.

(21) Appl. No.: 14/337,111

(22) Filed: Jul. 21, 2014

(51) Int. Cl.
*H01L 21/336* (2006.01)
*H01L 45/00* (2006.01)

(52) U.S. Cl.
CPC .............................. *H01L 45/1666* (2013.01)

(58) Field of Classification Search
CPC ............. H01L 45/1666; H01L 21/3065; H01L 45/1675; B81C 2201/0132; H01F 41/308; H05K 2201/0166
See application file for complete search history.

(56) References Cited

U.S. PATENT DOCUMENTS

| | | | | |
|---|---|---|---|---|
| 8,310,019 B2* | 11/2012 | Nam | ...................... | B82Y 25/00 257/421 |
| 9,236,570 B2* | 1/2016 | Chang | ................. | H01L 45/1253 |
| 9,245,789 B2* | 1/2016 | Okamoto | .......... | H01L 21/31116 |
| 2010/0245029 A1* | 9/2010 | Schricker | ............ | H01L 27/2409 338/13 |
| 2010/0327248 A1* | 12/2010 | Khoueir | .................. | H01L 43/12 257/2 |
| 2011/0272664 A1* | 11/2011 | Tada | ..................... | H01L 27/228 257/4 |
| 2012/0161095 A1* | 6/2012 | Mikawa | ................ | H01L 27/101 257/4 |
| 2012/0286231 A1* | 11/2012 | Saito | ................... | H01L 23/5228 257/4 |
| 2014/0113430 A1* | 4/2014 | Hayakawa | .............. | H01L 45/08 438/385 |
| 2014/0192589 A1* | 7/2014 | Maxwell | ................. | H01L 45/12 365/148 |
| 2015/0262864 A1* | 9/2015 | Okamoto | .......... | H01L 21/31116 438/671 |
| 2015/0263069 A1* | 9/2015 | Jo | ........................ | H01L 45/085 365/148 |

\* cited by examiner

*Primary Examiner* — Latanya N Crawford
(74) *Attorney, Agent, or Firm* — Amin, Turocy & Watson, LLP

(57) ABSTRACT

A method includes patterning a layered structure comprising a monolithic stack including a bottom electrode surrounded by a dielectric material, a switching material, a barrier material, a dielectric hardmask, and a patterned photoresist formed above and adjacent to a portion of the dielectric hardmask. The patterning includes patterning the dielectric hardmask using a first etchant and employing the patterned photoresist as a mask, patterning the barrier material using a second etchant and employing a portion of the dielectric hardmask remaining after the patterning the dielectric hardmask as a mask, and patterning the switching material using ion milling or etching and employing the portion of the dielectric hardmask remaining after the patterning the barrier material as a mask.

20 Claims, 15 Drawing Sheets

RESISTIVE RANDOM ACCESS MEMORY (RRAM) CELL AND METHOD FOR FORMING THE RRAM CELL

TECHNICAL FIELD

This application relates generally to a resistive random access memory (RRAM) cell and method for forming the RRAM cell.

BACKGROUND

The inventors of the present disclosure have been focusing research in the area of resistive memory within the field of integrated circuit technology. While much of resistive memory technology is in the development stage, various technological concepts for resistive memory have been demonstrated by the inventors, and are in one or more stages of verification to prove or disprove associated theory(ies). The inventors believe that resistive memory technology promises to hold substantial advantages over semiconductor transistor-based technologies in the electronics industry.

The semiconductor transistor has been the basis of electronic memory and processing devices for the past several decades. Over time, advancement in technology has roughly followed Moore's Law, which predicts an increase in a number of semiconductor devices, such as transistors, that can be fabricated on a given geometric area of a semiconductor chip. One implication of increasing number of semiconductor devices is increasing memory capacity and processing power for the semiconductor chip and associated electronic devices. Moore's Law has been fairly accurate at predicting the advancement of semiconductor technology up to the present.

The inventors of the disclosed subject matter have worked with two-terminal memory devices, such as resistive memory, as a replacement for three-terminal semiconductor transistors. Based on their experience in the field, mathematical predictions and test results, the inventors believe that two-terminal memory devices can overcome drawbacks of three-terminal semiconductor transistors in various categories related to performance and reliability. Examples include write, erase and access times, data reliability, device density, and others. Accordingly, the inventors are in the process of discovering new ways to create or fabricate two-terminal memory technologies and how they can replace conventional micro electronic systems and devices.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
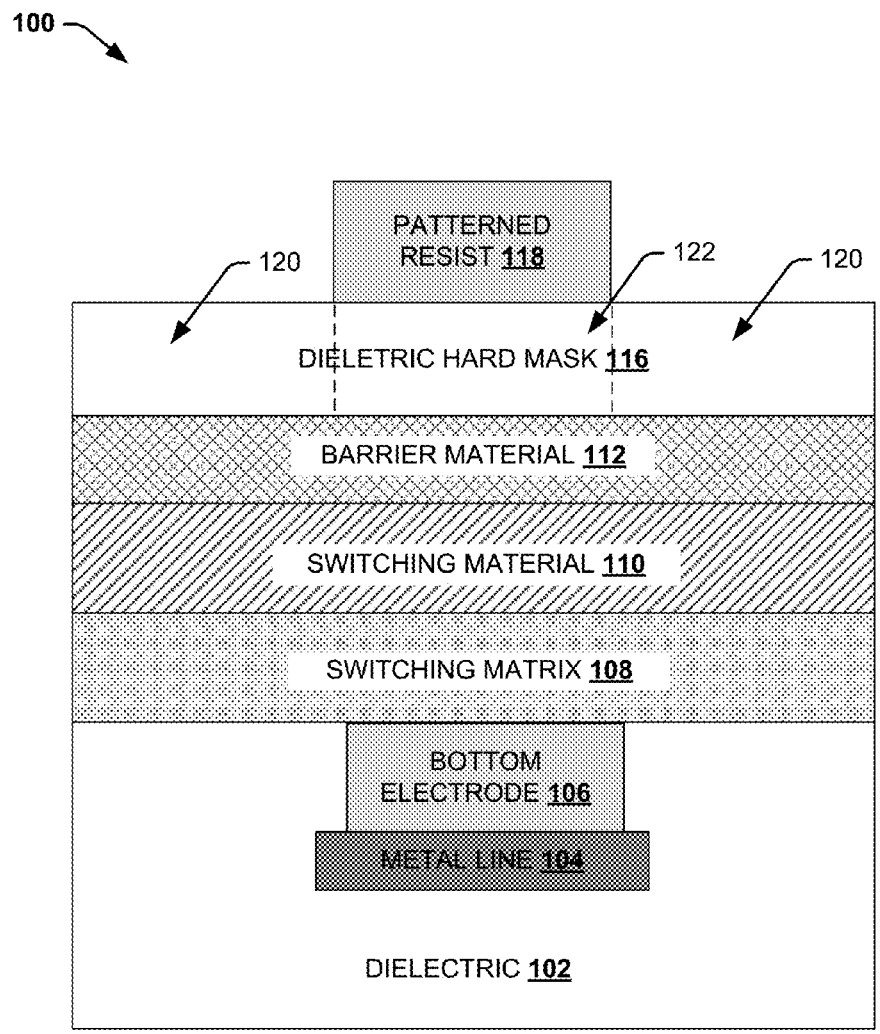
FIG. 1 illustrates a multilayered structure that serves as a precursor to formation of a RRAM cell according to a first embodiment of the subject disclosure.

The innovation is described with reference to the drawings, wherein like reference numerals are used to refer to like elements throughout. In the following description, for purposes of explanation, numerous specific details are set forth in order to provide a thorough understanding of this innovation. It may be evident, however, that the innovation can be practiced without these specific details. In other instances, well-known structures and components are shown in block diagram form in order to facilitate describing the innovation.

By way of introduction, the subject matter described in this disclosure relates to two-terminal memory devices and methods for fabricating two-terminal memory cells. A two-terminal memory device as described herein can include a plurality of stacked and patterned layers. In some embodiments, these layers can include a bottom electrode formed above and adjacent to a metal line, wherein the bottom electrode and the metal line are surrounded by a dielectric material, a switching matrix formed above and adjacent to the bottom electrode, a switching material formed above and adjacent to the switching matrix, a barrier material formed above and adjacent to the switching material, and a dielectric hardmask formed above and adjacent to the barrier material. Other embodiments can include fewer layers, or additional layers (e.g., a barrier layer to mitigate oxidation, an electrical interface layer to electrically connect to a metal line, a barrier layer to mitigate ion migration, and so forth).

The inventors of the subject disclosure have observed that patterning layers of a two-terminal memory cell using a three step selective subtractive etch process facilitates efficient and clean removal of portions of the various layers of the two-terminal memory device without damaging the integrity of remaining portions of the various layers. In particular, starting with a monolithic stack formed on a substrate (e.g., including the layers as described above), a first etch step is performed. During the first etch step, the dielectric hardmask can be etched using a photoresist to define the size and structure of the two-terminal memory cell. Moreover, the photoresist can be removed (e.g., via ashing) and the exposed surface of a partially patterned memory device is optionally cleaned (e.g., using a cleaning solvent). Next, a second etch step is performed wherein the barrier material can be etched using the patterned dielectric hardmask as a mask. Additionally, the exposed surface of the partially patterned two-terminal memory device is optionally cleaned. The switching matrix and material can then be concurrently removed during a third etch and clean step without damaging or mitigating damage to the bottom electrode and metal line.

The inventors believe that the sequence and characteristics of the first, second and third etch steps can be carefully tailored to preferentially and efficiently etch the dielectric hardmask layer, the barrier material layer, and the switching matrix/switching material layer, respectively, without damaging other layers or features of a two-terminal memory cell. For example, selective plasma etching can be employed during the first and second etch steps to preferentially patterned the dielectric hardmask and the barrier material. By separating the first and second etch steps, damage and byproducts associated with the respective etch steps and materials of the layers removed in the respective etch steps can be isolated and efficiently removed prior to performing a subsequent etch step. For example, after the first etch step, the barrier material is exposed. The barrier material can however serve as a protection layer against damage to remaining portions of the memory cell associated with the first etch step. The barrier material can also protect underlying layers of the memory cell during post first etch cleaning and photoresist removal prior to performing the second etch step. The barrier material can then be removed using another selective plasma etch during the second etch step while the patterned dielectric hardmask can serve as a mask.

In addition, by separating the third etch step from the first and second etch steps, ion milling or etching using inert gas argon (Ar), krypton (Kr), or xenon (Xe) can be employed during the third etch step to minimize redeposition of materials of the switching matrix/switching material onto sidewalls of the various patterned layers and to prevent migration of the materials (as well as migration material of other layers of the patterned stack). Further, because the photoresist is removed prior to the third etch step, undesired photoresist polymers are not generated and disposed onto patterned features of the memory cell. As a result, a post etch clean can be performed after the third etch step using merely a gentle solvent (e.g., dilute HF, ultra dilute HF, EKC or DI Rinse).

This disclosure relates to two-terminal memory cells employed for digital information storage. In particular, this disclosure relates to two-terminal memory cells that employ resistive technology, such as a resistive-switching two-terminal memory cells, and methods for fabricating the resistive-switching two-terminal memory cells. An example of a resistive switching two-terminal memory device, though not exhaustive, can include a resistive random access memory (RRAM) cell.

Resistive-switching two-terminal memory cells (also referred to as resistive-switching memory cells or resistive-switching memory), as utilized herein, comprise circuit components having two conductive contacts (also referred to herein as electrodes or terminals, though in some embodiments a metal wire(s) of a memory device can serve as a conductive contact(s)) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a pulse width, a voltage or current polarity, or the like, or a suitable combination thereof.

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe, etc.), a resistive switching layer (RSL) and an active metal layer for providing filament forming particles to the RSL. The p-type or n-type Si bearing layer can include a p-type or n-type polysilicon, p-type or n-type SiGe, or the like. The RSL (which can also be referred to in the art as a resistive switching media (RSM), and is analogous to the active region described above) can comprise, e.g., an undoped amorphous Si layer, a semiconductor layer having intrinsic characteristics, a Si sub-oxide, and so forth. Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the present application are of the opinion that two-terminal memory devices, such as resistive-switching memory devices, have various advantages in the field of electronic memory. For example, resistive-switching technology can generally be small, consuming silicon area on the order of $4F^2$ per adjacent resistive-switching device for a single bit device (e.g., a memory cell comprising two resistive-switching devices would therefore be approximately $8F^2$ if constructed in adjacent silicon space). Non-adjacent resistive-switching devices, e.g., stacked above or below each other, can consume as little as $4F^2$ for a set of multiple non-adjacent devices. Moreover, multi-bit devices having two, three or more bits per memory cell can result in even greater densities in terms of bits per silicon area consumed. These advantages can lead to great semiconductor component density and memory density, and low manufacturing costs for a given number of digital storage bits. The inventors also believe that resistive-switching memory can exhibit fast programming speed and low programming current, and smaller cell sizes enabling greater component densities. Other benefits include non-volatility, having the capacity to store data without continuous application of power, and capacity to be built between metal interconnect layers, enabling resistive-switching based devices to be usable for two-dimension as well as three-dimension semiconductor architectures.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. For instance, various subsets of these devices can have relatively fast switching times, good durability, high memory density, low cost fabrication, long life, or the like, or combinations thereof. Meanwhile, the various subsets can also be difficult to fabricate, have compatibility problems with many common CMOS fabrication processes, poor read performance, small on/off resistance ratios (e.g., leading to small sensing margin) or poor thermal stability, as well as other problems. Though resistive-switching memory technology is considered by the inventors to be one of the best technologies having the most benefits and least detriments, other two-terminal memory technologies can be utilized for some of the disclosed embodiments, where suitable to one of ordinary skill in the art.

Referring now to the drawings, FIGS. 1-5 present one of many possible exemplary embodiments of forming a memory device (e.g., a resistive memory cell) in accordance with aspects disclosed herein. FIG. 1 illustrates a cross sectional view of a multilayer structure 100 that is an intermediate state of a portion of an exemplary memory device (e.g., a resistive-switching device). In particular, a memory device can be formed starting with structure 100 and performing a three step integrated subtractive etching process in accordance with aspects and embodiments described herein.

Structure 100 includes a bottom electrode 106 formed above and adjacent to a metal line 104. The bottom electrode and the metal line are surrounded by a dielectric material 102. Structure 100 further includes a switching matrix 108 formed above and adjacent to the bottom electrode 106, a conductive material 110 formed above and adjacent to the switching matrix 108, a barrier material 112 formed above and adjacent to the conductive material 110, and a dielectric hardmask 116 formed above and adjacent to the barrier material 112. Structure 100 further includes a patterned resist 118 formed above and adjacent to the dielectric hardmask 116. In particular, patterned resist 118 covers portions of the dielectric hardmask 116 while leaving other portions of the dielectric hardmask 116 exposed.

In various embodiments, bottom electrode 106 can be formed of a suitable conductive material. Examples can include a p-type SiGe, a p-type Si, an n-type SiGe, an n-type Si, Pt, Pd, TiN, W, Cu, Al, or the like. In other aspects, suitable combinations of the foregoing conductive materials can be employed for bottom electrode 106. The thickness of the bottom electrode can vary. In an aspect, the bottom electrode 106 has a thickness between about 30 nanometers (nm) and 500 nm. In another aspect, the bottom electrode 106 has a thickness between about 100 nm and 400 nm. Still in yet another aspect, the bottom electrode 106 has a thickness between about 200 nm and 350 nm. In some embodiments, bottom electrode 106 may be formed within a dielectric via to metal line 104 and then planarized; in other embodiments, bottom electrode 106 may be formed as a pillar, covered with a dielectric and then planarized; or the like.

In an aspect, metal line 104 can include W, TiN, doped SiGe, and doped Si. Metal line 104 can provide be a wire of a CMOS memory device, such as a wordline, bitline, select line, data line, and so forth, a metal interconnect, a metal via, etc, as well as other examples. Dielectric material 102 can include but is not limited to Silicon dioxide ($SiO_2$).

Structure 100 further includes a switching matrix 108 formed above and adjacent to the bottom electrode 106 and a conductive material 110 formed above and adjacent to the switching matrix 108. Switching matrix 108 can be formed of a suitable material having relatively high electrical resistance, as well as permeability to metallic or electrically conductive particles (e.g., atoms, compounds, ions, etc. derived from conductive material 110). Examples of materials suitable for switching matrix 108 can include silicon-oxide ($SiO_N$, where N is a suitable positive integer), titanium-oxide ($TiO_B$, where B is a suitable positive integer), amorphous silicon (a-Si), aluminum-oxide ($AlO_C$, where C is a suitable positive integer), hafnium-oxide ($HfO_D$, where D is a suitable positive integer), nickel-oxide ($NiO_E$, where E is a suitable positive integer), tantalum-oxide (TaO$_F$, where F is a suitable positive integer), niobium-oxide (NbO$_G$, where G is a suitable positive integer), zinc-oxide (ZnO$_H$, where H is a suitable positive integer), zirconium-oxide (ZrO$_I$, where I is a suitable positive integer), gadolinium-oxide (GdO$_J$, where J is a suitable positive integer), or the like, or suitable combinations thereof. The switching matrix includes defects due to its non-stiochiometric composition into which conductive particles from conductive material 110 can become trapped.

Conductive material 110 can be made of one or more conductive materials having neutral metal atoms. Examples of materials suitable for conductive material 110 can include Pd, Ag, Pt, Au, Cu, iridium (Ir), ruthenium (Ru), Al, TiN, Ti, W or the like, or suitable combinations thereof. The switching material is configured to provide conductive material 110 that migrates into switching matrix 108, upon application of a voltage applied thereto.

In some embodiments, barrier material 112 can include a suitable conductive encapsulating metal that prevents or mitigates diffusion of the switching material out of the depicted layer of conductive material 110, for instance. In addition, barrier material 112 can prevent or mitigate atoms or compounds of conductive material 110 from directly contacting atoms or compounds of a top electrode (not depicted), avoiding chemical reactions there between, as one example. Accordingly, barrier material 112 can facilitate improved longevity and operational integrity for a memory cell formed from structure 100. Examples of barrier material 112 can include TiN, Ti, W, tantalum-nitride (TaN) or the like, or suitable combinations thereof. The thickness of the barrier material can vary. In an aspect, the barrier material 112 has a thickness between about 50 and 150 nm.

Dielectric hardmask 116 formed above and adjacent to barrier material 112 can include but is not limited to at least one of: silicon dioxide (SiO$_2$), silicon nitride (SiN), silicon carbon (SiC), or amorphous carbon. The thickness of the dielectric hardmask 116 can also vary. In an aspect, the dielectric hardmask 116 has a thickness between about 10 and 500 nm.

Formation of structure 100 can include any suitable memory device fabrication processes. General examples of memory device fabrication processes include masking, patterning, etching, cleaning, planarization, thermal oxidation, implant, annealing, thermal treatment, and deposition techniques normally used for making memory devices. For example, metal line 104 can be printed onto dielectric material 102 and bottom electrode 106 can then be subsequently formed over the metal line 104 via chemical vapor deposition (CVD), plasma enhanced CVD (PECVD) or low pressure CVD (LPCVD). Following deposition, the bottom electrode 106 can be planarized (e.g., using chemical mechanical planarization (CMP)) and then covered with additional dielectric material 102. The additional dielectric material can then be planarized (e.g., using CMP) to expose a surface of the bottom electrode 106. Thereafter, the switching matrix 108, conductive material 110, barrier material 112 and dielectric hardmask 116 can be sequentially formed over one another using various techniques (e.g., CVD, PECVD, LPCVD and the like).

Patterned resist 118 can be formed over dielectric hardmask 116 by any suitable manner. For example, patterned resist 118 can be formed using a resist by spin-on technique, spray techniques, CVD, and the like, over the dielectric hardmask 116. The resist can then be exposed to a pattern of radiation to develop the resist into the pattern. For example, a resist layer can be deposited over the dielectric hardmask 116 and heat can be optionally applied to the resist to remove existing solvents. Portions of the resist can then be removed to pattern the resist into patterned resist 118 leaving portions of the dielectric hardmask 116 exposed.

In an aspect, patterned resist 118 is a photoresist. According to this aspect, patterned resist 118 can be formed over the dielectric hardmask 116 using conventional photolithography techniques. For example, portions of the photoresist can be removed by exposing the photoresist resist to radiation in a suitable wavelength range. The resulting patterned resist 118 covers portions of the dielectric hardmask 116 while leaving other portions of the dielectric hardmask 116 exposed. It should be appreciated that FIG. 1 presents a cross section of a portion of the patterned resist 118 and that patterned resist 118 can have various suitable patterns that defined the structural array of a memory cell.

Examples of various resists include DQN resists (containing diazonaphthoquinone and a novolac polymer), chemically amplified resists (such containing a photoacid generator and a hydroxystyrene or t-butylacrylate polymer), polymethylmethacrylate resists, polyimide resists, polyester resists, melamine-formaldehyde polymers, polyvinylpyrrolidone, siloxane polymers, poly(p-tert-butoxycarbonyloxy-a-methylstyrene), poly(p-tert-butoxycarbonyloxystyrene), poly(tert-butyl p-vinylbenzoate), poly(tert-butyl p-isopropenylphenyloxyacetate), poly(tert-butyl methacrylate), partially t-butoxycarbonyloxy substituted poly-p-hydroxystyrene, partially t-butoxycarbonyloxy substituted poly-3-hydroxyphenyl phenylsiloxane, partially t-butyl substituted polymethacrylate, partially adamantyl substituted polymethacrylate and the like. All possible resist are not listed in the interest of brevity.

Figure 2:
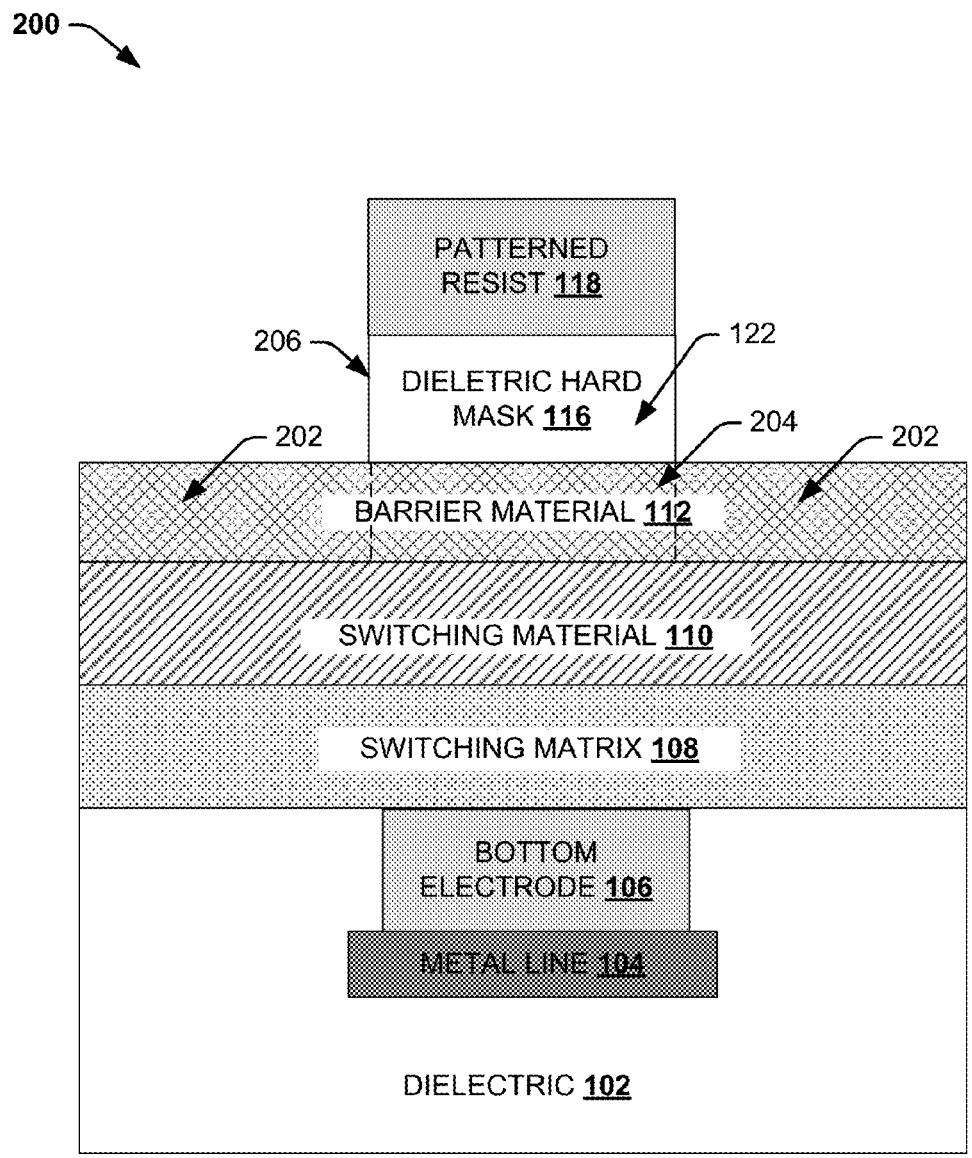
FIG. 2 illustrates a cross sectional view of a multilayer structure that is an intermediate state of a portion of an exemplary memory device, in accordance with the first embodiment.

FIG. 2 illustrates another cross sectional view of a multilayer structure 200 that is an intermediate state of a portion of an exemplary memory device (e.g., a RRAM device). As previously noted, a RRAM device can be formed starting with structure 100 and performing a three step integrated subtractive etching process in accordance with aspects and embodiments described herein. Structure 200 depicts processed structure 100 following a first etching step/process of the three step integrated subtractive etching process in accordance with aspects and embodiments disclosed herein. Repetitive description of like elements employed in respective embodiments of processes and devices described herein is omitted for sake of brevity.

As seen in structure 200, a portion of the dielectric hardmask 116 present in structure 100 has been removed. In particular, when processing structure 100 to form structure 200, a first etching process is performed wherein the dielectric hardmask 116 is patterned using the patterned resist 118 as a mask. For example, during the first etching process, a portion (e.g., portion 120 of structure 100) of the dielectric hardmask 116 not covered by the patterned resist 118 is removed and another portion (e.g., portion 122) of the dielectric hardmask covered by (e.g., adjacent to and directly below) the patterned resist 118 is remained. Patterning of the dielectric hardmask 116 uncovers or reveals the barrier material 112 there below. In particular, removal of portions 120 of the dielectric hardmask exposes portions 202 of the barrier material 112.

Etching involves chemical or physical removal of a material wherein a portion of the material is protected from removal by a "masking" material which resists the etching. During the first etching process, portions of the dielectric hardmask 116 not covered by patterned resist 118 can be etched by anisotropic etching using, for example, reactive ion etching (RIE) or plasma etching. Example etchants can include one or more of C4F8, C4F6, CHF3, CF4, CO, O2, N2, Ar.

In an exemplary embodiment, plasma etching is employed to etch the dielectric hardmask 116 using a photoresist material for the patterned resist 118. Plasma etchers can operate in several modes by adjusting the parameters of the plasma. In an aspect, plasma etching employed to etch the dielectric hardmask 116 is preformed between about 0.1 and 5.0 Torr. In an exemplary embodiment plasma etching employed to etch the dielectric hardmask 116 is preformed between at less than 1.0 Torr. The plasma produces energetic free radicals, neutrally charged, that react at the exposed surface of the dielectric hardmask 116 to erode portions of the dielectric hardmask 116 not covered by the patterned resist 118 (e.g., portions 120 of structure 100). The source gas for the plasma can contain small molecules rich in fluorine. In an aspect, a plasma containing oxygen is used to oxidize ("ash") the patterned resist 118 (e.g., photoresist) and facilitate its removal.

In an aspect, the patterned resist 118 contains a suitable material so that the patterned resist can serve as a mask for protecting the covered portions of the dielectric hardmask 116 from the etchant employed in the first etching process. In addition, the etchant chemical and technique employed for the first etching process can be selected to substantially remove the exposed portions of the dielectric hardmask 116 without damaging the patterned resist 118 or underlying layers (e.g., the barrier material 112, the conductive material 110, the switching matrix 108, or the bottom electrode 106).

The ability to preferentially etch a layer of multilayer structure without substantially damaging or removing other layers/portions of structure depends on the etch rate of the layer targeted for removal via etching, and the layer(s) adjacent to the targeted layer, with respect to the selected etchant chemical and technique. For example, the etchant chemical and technique employed in the first etching process can be selected to etch the dielectric hardmask 116 material at a much higher rate than the barrier material. In an aspect, the first etching process exhibits an etch selectivity for the dielectric hardmask 116 over the barrier material 112 at a ratio of greater than about 10:1. In addition, the material employed for the dielectric hardmask 116 can be selected to have a substantially different etch rate compared to the material selected for the barrier material 112 with respect to a particular etchant chemical/technique employed in the first etching process. For example, where the dielectric hardmask includes $SiO_2$, SiN, SiC, or amorphous carbon and the barrier material includes TiN, Ti, W, or TaN, plasma etching employing molecules rich in fluorine, carbon, oxygen and hydrogen can be employed to preferentially etch the dielectric hardmask over the barrier material at a rate of about 10:1.

With reference to structure 200, the result of the first etching process is the removal of exposed portions of the dielectric hardmask (e.g., portions 120 of structure 100) and exposure of portions of the barrier material (e.g., portions 202) not covered by the remaining portion (e.g., portion 122) of the dielectric hardmask 116. In an aspect, the first etching process removes substantially all of the exposed dielectric hardmask 116 without removing the barrier material 112. For example, the first etching process can remove 90 to 100% of the exposed dielectric hardmask while removing 0% of the barrier material 112. In another aspect, the first etching process can result in partial removal of the barrier material 112. For example, the first etching process can remove 100% of the exposed dielectric hardmask 116 and between 10 and 20% of the barrier material 112.

Figure 3:
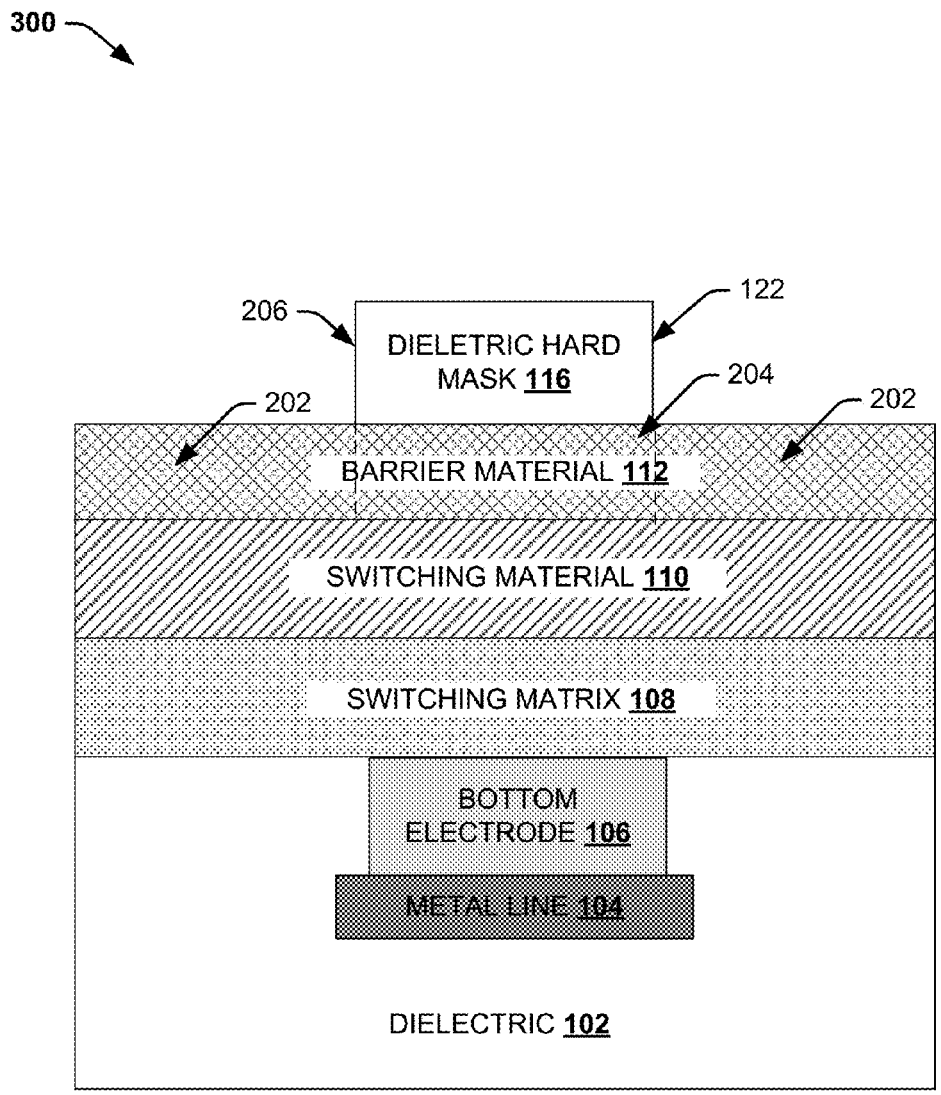
FIG. 3 illustrates a cross sectional view of another multilayer structure that is an intermediate state of a portion of an exemplary memory device, in accordance with the first embodiment.

FIG. 3 illustrates another cross sectional view of a multilayer structure 300 that is an intermediate state of a portion of an exemplary memory device (e.g., a RRAM device). Structure 300 depicts processed structure 200 following patterned resist removal after the first etching step/process in accordance with aspects and embodiments disclosed herein. Repetitive description of like elements employed in respective embodiments of processes and devices described herein is omitted for sake of brevity.

As seen in structure 300, patterned resist 118 present in structure 200 has been removed. In an aspect, following the first etching process and removal of the portions of the dielectric hardmask 116 not covered by the patterned resist (e.g., portions 120 of structure 100), patterned resist 118 is removed. In another aspect, the patterned resist 118 can be removed after a second etching process, wherein the barrier material is patterned using portion 122 of the dielectric hardmask as a mask. The second etching process is discussed in greater detail with respect to FIG. 4.

In an aspect, patterned resist 118 is removed using conventional ashing techniques. For example plasma ashing 118 can be employed to remove patterned resist 118 where patterned resist 118 is a photoresist. According to this example, ashing involves using a plasma source to generate a monatomic reactive species. Oxygen or fluorine are suitable reactive species, however other reactive species are contemplated within the spirit of the subject disclosure. The reactive species is applied to the surface of the photoresist and combines with the photoresist to form ash which is removed with a vacuum pump.

In addition, following the first etching process prior to removal of the patterned resist 118 or after removal of the patterned resist 118, a post etch cleaning processed can be applied to structure 200 or structure 300, respectively. Post etch cleaning facilitates removal of residues and damage caused by the first etching process and removal of the patterned resist. In particular, post etch residues are typically deposited on the exposed surface of the barrier material 112 layer and exposed sidewalls (e.g., sidewall 206) of the dielectric hardmask 116 following the first etching process. For example, post-plasma etch residues can include chemical elements present in the dielectric hardmask 116 and in the plasma gases. According to this example, if a TiN hardmask 116 is employed the post-plasma etch residues can include titanium-containing species. In addition, removal of the patterned resist 118 via ashing can result in the formation of polymers on the exposed surface of the barrier material 112 layer and exposed sidewalls (e.g., sidewall 206) of the dielectric hardmask 116.

Post etch cleaning can be applied to the exposed surfaces of structure 200 or 300 to remove post etch or post ash residues and damage (e.g., to sidewalls 206 of the dielectric hardmask) prior to performance of a second etching process. In an aspect, post etch cleaning can include wet chemical cleaning with a chemical rinse. For example, $O_2$ ash, $O_2/CF_4$ ash, EKC, DMSO (dimethyl sulfoxide), HF, or DI Rinse can be employed to for post etch cleaning. However, various other post etch cleaning techniques (e.g., dry cleaning) are contemplated as being within the scope of this disclosure.

According to this aspect, the barrier material 112 can protect other layers of structure 200 or structure 300 (e.g., the conductive material 110, switching matrix 108, bottom electrode, etc. performed after the first etching process) from the chemical degradation associated with the first plasma etching post etch cleaning/photoresist removal. For example, the barrier material 112 can prevent polymer deposition associated with ashing and post etch cleaning onto the conductive material 110. Depending on the post etch cleaning chemical composition and technique employed, a small portion of the exposed regions of the barrier material 112 (e.g., portions 202) can be removed during post etch cleaning and patterned resist removal. Nevertheless, this portion of the barrier material is less than 15% (e.g., less than 20 nm) of the total thickness of the barrier material.

Figure 4:
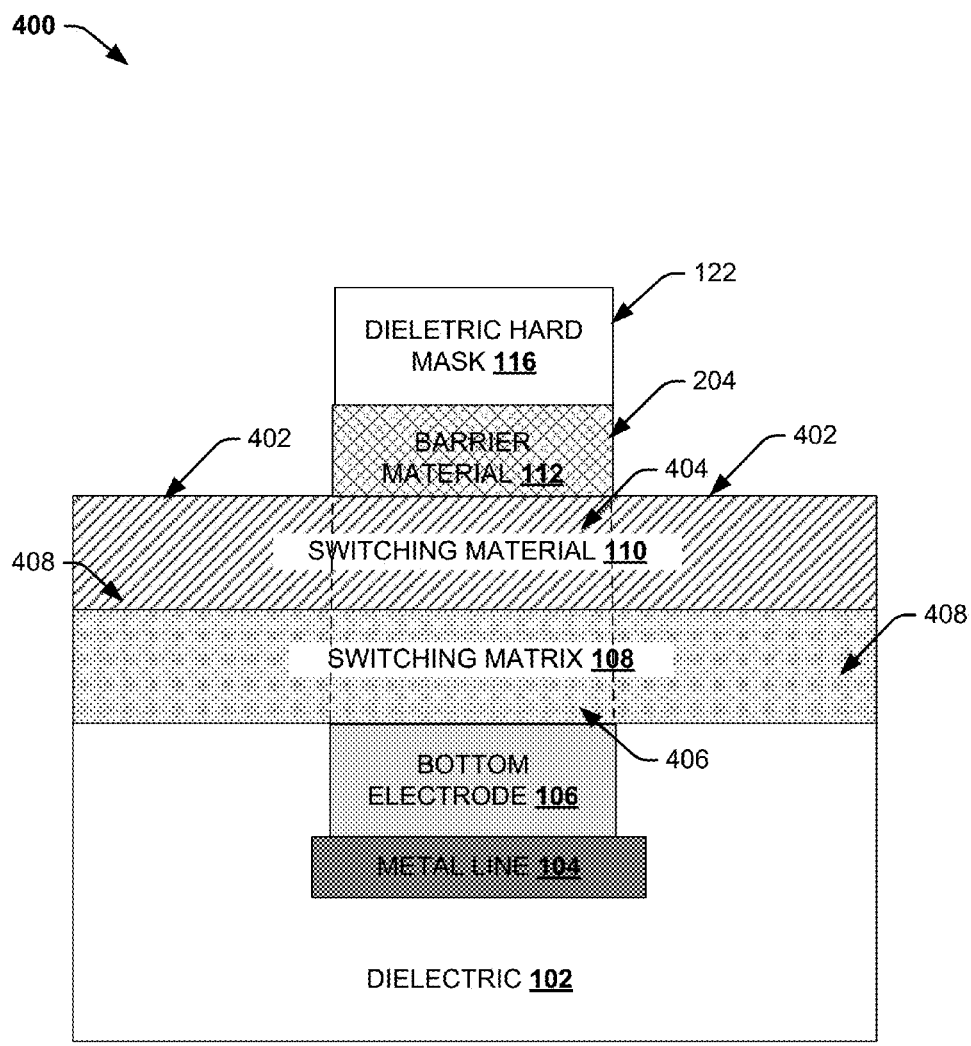
FIG. 4 illustrates a cross sectional view of another multilayer structure that is an intermediate state of a portion of an exemplary memory device, in accordance with the first embodiment.

FIG. 4 illustrates another cross sectional view of a multilayer structure 400 that is an intermediate state of a portion of an exemplary memory device (e.g., a RRAM device). Structure 400 depicts processed structure 300 following the second etching step/process of the three step integrated subtractive etching process in accordance with aspects and embodiments disclosed herein. Repetitive description of like elements employed in respective embodiments of processes and devices described herein is omitted for sake of brevity.

As seen in structure 400, a portion of the barrier material 112 present in structure 300 has been removed. In particular, when processing structure 300 to form structure 400, a second etching process is performed wherein the barrier material 112 is patterned using the patterned portion (e.g., portion 122) of the dielectric hardmask 116 as a mask. For example, during the second etching process, a portion (e.g., portions 202 of structure 300) of the barrier material 112 not covered by the remaining portion 122 of the dielectric hardmask is removed and another portion (e.g., portion 204) of the barrier material 112 covered by (e.g., adjacent to and directly below) the patterned dielectric hardmask 116 is remained. Patterning of the barrier material 112 uncovers or reveals the conductive material 110 there below. In particular, removal of portions 202 of the barrier material exposes portions 402 of the conductive material 110.

Similar to the first etching process, the second etching process can include anisotropic etching using, for example, reactive ion etching (RIE) or plasma etching. In an exemplary embodiment, plasma etching is employed to etch the barrier material 112. The plasma produces energetic free radicals, neutrally charged, that react at the exposed surface of the barrier material 112 to erode portions of the barrier material not covered by the dielectric hardmask 116 (e.g., portions 202 of structure 300. The source gas for the plasma can contain small molecules rich in Chlorine (Cl), BCl3, halogens, Ar and N2, as one example. In an aspect, plasma etching employed to etch the barrier material 112 is performed between about 0.01 and 0.1 Torr.

The second etching process is preferentially tailored to etch the barrier material 112 at much higher rate than the dielectric hardmask 116 and the switching material. In other words, a plasma etchant technique and chemical that is employed in the second etching process is tailored so that it is selective towards the barrier material over the dielectric hardmask material and the conductive material 110. Accordingly, the etchant chemical/technique employed to in the second etching process will be different from the etchant chemical/technique employed in the first etching process.

In an aspect, the second etching process exhibits an etch selectivity for the barrier material over the dielectric hardmask 116 or switching material at a ratio greater than 10:1. In addition, the material employed for the dielectric hardmask 116 can be selected to have as substantially different etch rate compared to the material selected for the barrier material 112 with respect to a particular etchant chemical/technique employed in the second etching process. For example, where the dielectric hardmask includes $SiO_2$, SiN, SiC, or amorphous carbon and the barrier material includes TiN, Ti, W, or TaN, plasma etching employing molecules rich in chlorine (e.g., as opposed to fluorine in the first etching process) can be employed to preferentially etch the barrier material over the dielectric hardmask 116 at a rate of about 10:1.

With reference to structure 400, the result of the second etching process is the removal of exposed portions of the barrier material (e.g., portions 202 of structure 300) and exposure of portions of the switching material (e.g., portions 410) not covered by the remaining portion (e.g., portion 122) of the dielectric hardmask 116 and barrier material (portion 204). In an aspect, the second etching process removes substantially all of the exposed barrier material without removing the conductive material 110. For example, the second etching process can remove 90 to 100% of the exposed barrier material 112 while removing 0% of the switching material. In another aspect, the second etching process can result in partial removal of the conductive material 110. For example, the second etching process can remove 100% of the exposed barrier material and between 1.0 and 50% of the switching material. In addition, depending on the etch selectivity of the etchant chemical and technique employed in the second etching process, a portion of the dielectric hardmask 116 may also be removed. However, this portion is minimal (e.g., less than 10% or less than 20 nm) and does not have harmful effects for the final RRAM device.

A post second etch cleaning process can also be applied to the surface of structure 400 following the second etch process (and prior to the third etching process) to remove facilitate removal of residues and damage caused by the second etching process. In an aspect, this second post etch cleaning process can include wet chemical cleaning with a chemical rinse (e.g., using O2 ash, O2/CF4 ash, EKC, DMSO (dimethyl sulfoxide), HF, or DI Rinse). However, various other post etch cleaning techniques (e.g., dry cleaning) are contemplated as being within the scope of this disclosure.

Figure 5:
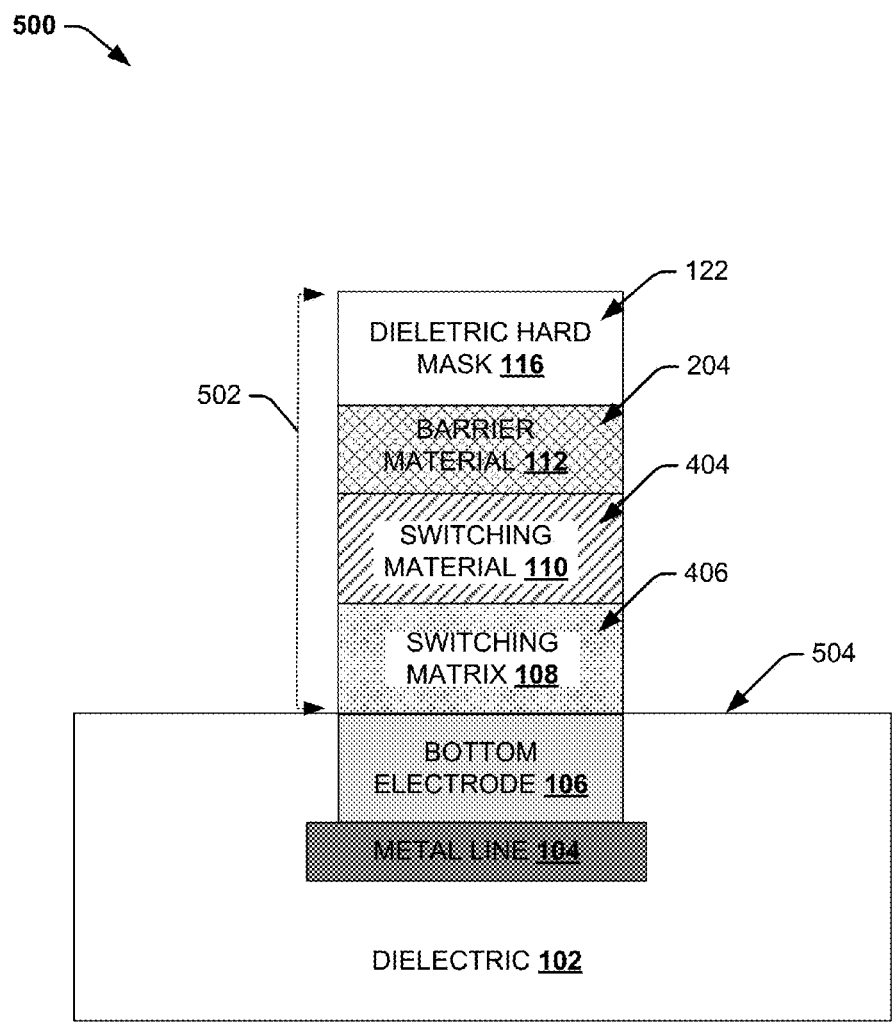
FIG. 5 illustrates a cross sectional view of another multilayer structure that is an intermediate state of a portion of an exemplary memory device, in accordance with the first embodiment.

FIG. 5 illustrates another cross sectional view of a multilayer structure 500 that is an intermediate state of a portion of an exemplary memory device (e.g., a RRAM device). Structure 500 depicts processed structure 400 following the third etching step/process of the three step integrated subtractive etching process in accordance with aspects and embodiments disclosed herein. Repetitive description of like elements employed in respective embodiments of processes and devices described herein is omitted for sake of brevity.

As seen in structure 500, portions of the conductive material 110 (e.g., portions 402) and switching matrix (portions 408) present in structure 400 have been removed. In particular, when processing structure 400 to form structure 500, a third etching process is performed wherein the conductive material 110 and switching matrix 108 are patterned (together) using the patterned portion (e.g., portion 122) of the dielectric hardmask 116 as a mask. For example, during the third etching process, portions of the conductive material 110 (e.g., portions 402) and switching matrix (portions 408) not covered by the remaining portion 122 of the dielectric hardmask is removed and other portions of the conductive material 110 and switching matrix 108 (e.g., portions 404 and 406 respectively) covered by the patterned dielectric hardmask 116 is remained. Patterning of the conductive material 110 and switching matrix 108 uncovers or reveals part of the dielectric layer 102 without damaging the bottom electrode 106 and metal line 104.

Unlike the first and second etching processes, the third etching process employs ion milling. Ion milling uses lower pressures than plasma etching. It bombards the surface of the material being etched (e.g., the conductive material 110 and switching matrix 108) with energetic ions of noble gases, such as Ar, Kr, or Xe, which knock off atoms from the surface material by transferring momentum. Because the etching is performed by ions, which approach the wafer approximately from one direction, this process is highly anisotropic. Ion milling utilizes a neutralized beam so no charging eliminates or minimizes electrical damage to structure 500. In addition, because the patterned resist 118 (e.g., a photoresist) is not present during ion milling, resist polymers are not generated. Therefore, cleaning after the third etching step is simplified (e.g., ashing is not necessary, only solvent strip).

In an aspect, at least one of Ar, Kr or Xe is employed to with ion milling to remove portions of the conductive material 110 and switching matrix 108. Because these gases do not substantially react with the other RRAM materials (e.g., the materials employed for the barrier material 112 and dielectric hardmask 116), residue material (e.g., metal residues from the barrier material 112) is minimized on the sidewalls (e.g., sidewalls 502) of the patterned structure.

In another aspect, ion milling is employed to etch the conductive material 110 and switching matrix 108 with an ion beam density between about 0.1 to 10 $mA/cm^2$. This minimizes migration of memory cell materials during fabrication. In some aspects, structure 400 can be cooled prior to or during ion milling, further minimizing migration of RRAM materials. For example, structure 400 can be cooled to a temperature less than 100° C. (e.g., using water cooling).

In another aspect, ion milling is employed to etch the conductive material 110 and switching matrix 108 with an ion beam density between about 1.0 to 5.0 $mA/cm^2$. In addition, the pressure employed for the ion milling can be between about $1.0E^5$ to about $1.0E^3$ Torr. Further, the incident angle of the ion beam can be from about +45° to about −45°. By employing an incident angle of about 0 to about 45°, re-deposition of etched materials onto the sidewalls (e.g., sidewalls 502) of the patterned structure is minimized.

A second post etch cleaning process can also be applied to the surface of structure 500 following the third etch process to remove facilitate removal of residues and damage caused by the third etching process. In an aspect, this third post etch cleaning process can include wet chemical cleaning with a chemical rinse. However, various other post etch cleaning techniques (e.g., dry cleaning) are contemplated as being within the scope of this disclosure.

In some aspects, after the full stack 500 is etched (e.g., after the third etch process) and cleaned, an oxide gap fill can be deposited over the structure. At this time CMP can be performed to polish the oxide and the barrier material 112 can also serve as a stop layer for the CMP.

Figure 6:
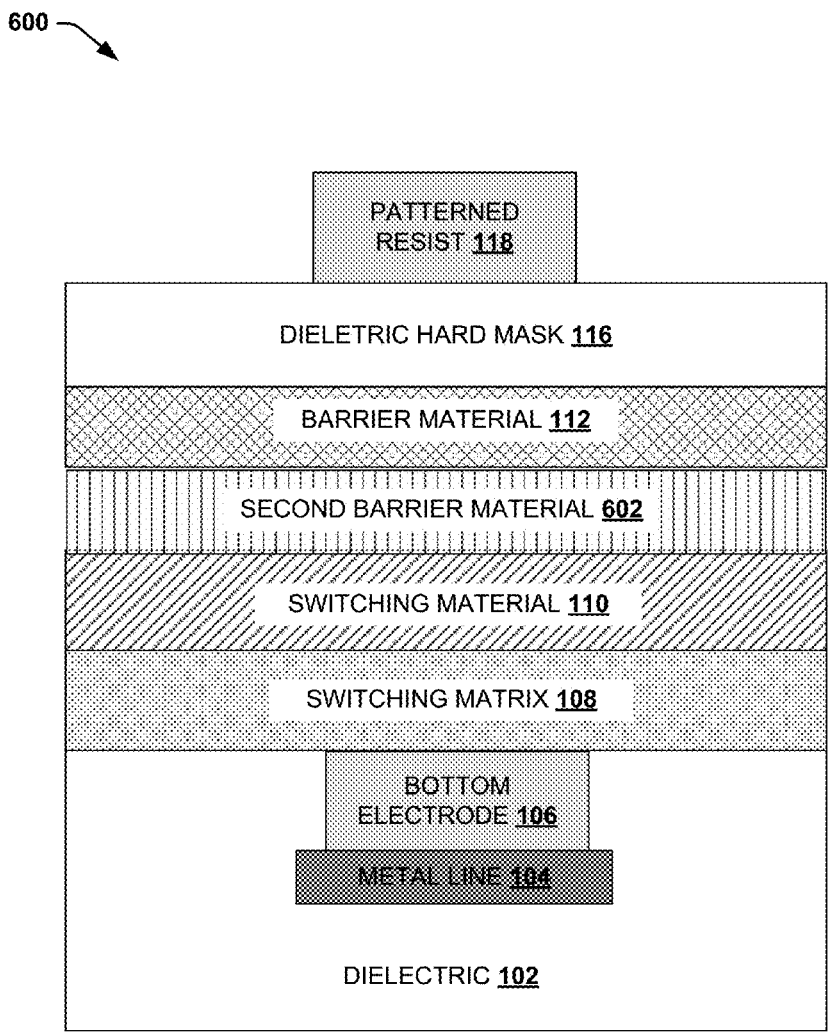
FIG. 6 illustrates a multilayered structure that serves as a precursor to formation of a RRAM cell according to a second embodiment of the subject disclosure.

FIGS. 6-10 present another exemplary embodiment of forming a memory device (e.g., a RRAM device) in accordance with aspects disclosed herein. FIG. 6 illustrates a cross sectional view of another multilayer structure 600 that is an intermediate state of a portion of an exemplary memory device (e.g., a RRAM device). In particular, a RRAM device can be formed starting with structure 600 and performing a three step integrated subtractive etching process in accordance with aspects and embodiments described herein.

Structure 600 includes same or similar features as structure 100 with the addition of a second barrier material layer 602 formed between barrier material 112 and the conductive material 110. Similar to barrier material 112, second barrier material 602 can include a suitable conductive encapsulating metal that is selected to mitigate oxidation of other layers of structure 600, mitigate migration of atoms or compounds between layers, prevent chemical interaction of materials between layers, or the like, or a suitable combination of such functions. For example, barrier material 602 can include TiN, Ti, W, TaN or the like, or suitable combinations thereof. However, second barrier material 602 and barrier material 112 can be selected to have substantially different etch selectivities. The thickness of the second barrier material 602 can vary. In an aspect, the second barrier material 602 has a thickness between about 50 and 150 nm.

Figure 7:
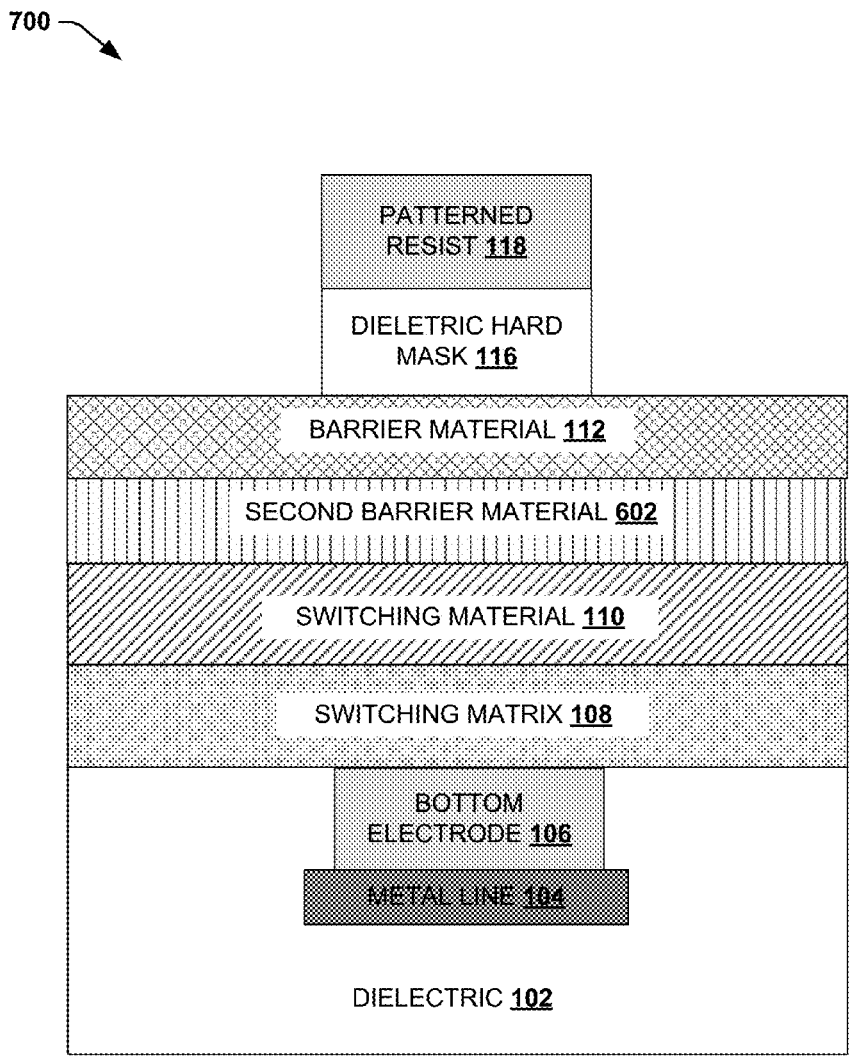
FIG. 7 illustrates a cross sectional view of a multilayer structure that is an intermediate state of a portion of an exemplary memory device, in accordance with the second embodiment.

FIG. 7 illustrates another cross sectional view of a multilayer structure 700 that is an intermediate state of a portion of an exemplary memory device (e.g., a RRAM device). As previously noted, a RRAM device can be formed starting with structure 600 and performing a three step integrated subtractive etching process in accordance with aspects and embodiments described herein. Structure 700 depicts processed structure 600 following a first etching step/process of the three step integrated subtractive etching process in accordance with aspects and embodiments disclosed herein. Repetitive description of like elements employed in respective embodiments of processes and devices described herein is omitted for sake of brevity.

As seen in structure 700, a portion of the dielectric hardmask 116 present in structure 600 have been removed. In particular, when processing structure 600 to form structure 700, a first etching process is performed that can include same or similar aspects described regarding the first etching process described with respect to structure 200. According to this embodiment, the dielectric hardmask 116 is etched using barrier material 112 as a stopping layer. Only a small portion of the barrier material 112 may be removed during the first etching step.

Figure 8:
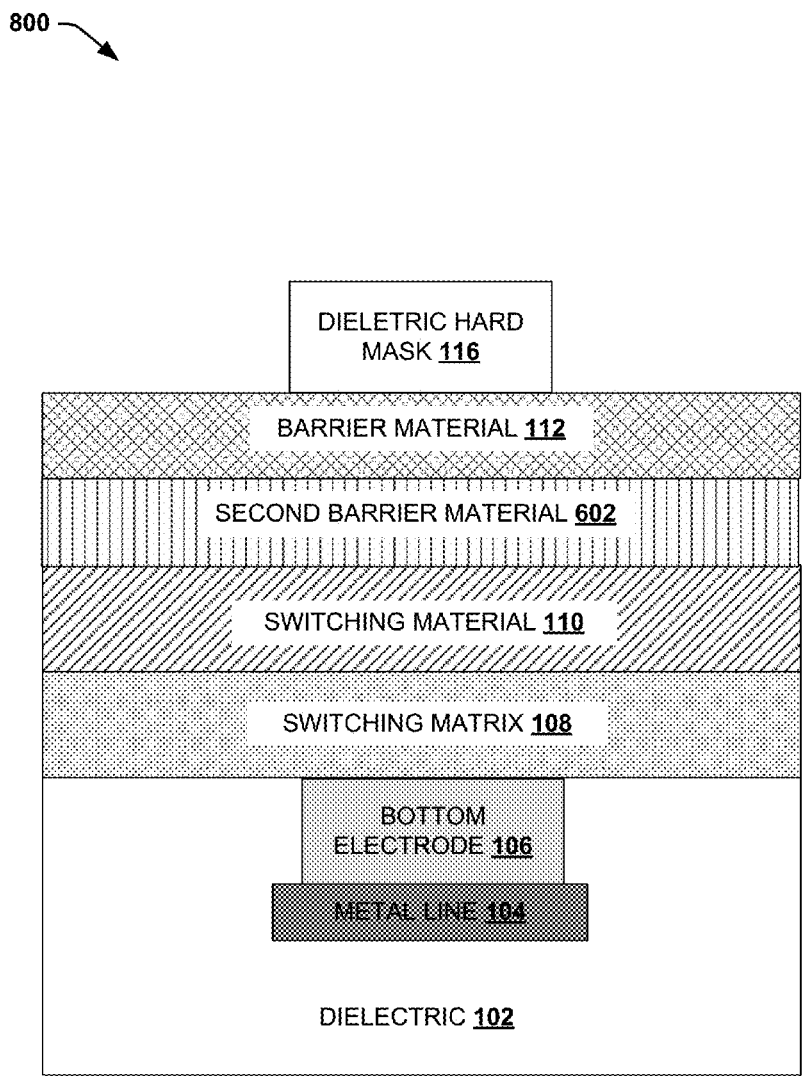
FIG. 8 illustrates a cross sectional view of another multilayer structure that is an intermediate state of a portion of an exemplary memory device, in accordance with the second embodiment.

FIG. 8 illustrates another cross sectional view of a multilayer structure 800 that is an intermediate state of a portion of an exemplary memory device (e.g., a RRAM device). Structure 800 depicts processed structure 700 following patterned resist removal after the first etching step/process in accordance with aspects and embodiments disclosed herein. As seen in structure 800, patterned resist 118 present in structure 700 has been removed. Patterned resist 118 removal associated with structure 800 can proceed in as same or similar manner described regarding patterned resist removal in structure 300. Similarly, post first etch cleaning can be applied to structure 800 in a same or similar manner to that described with respect to structure 300. Repetitive description of like elements employed in respective embodiments of processes and devices described herein is omitted for sake of brevity.

Figure 9:
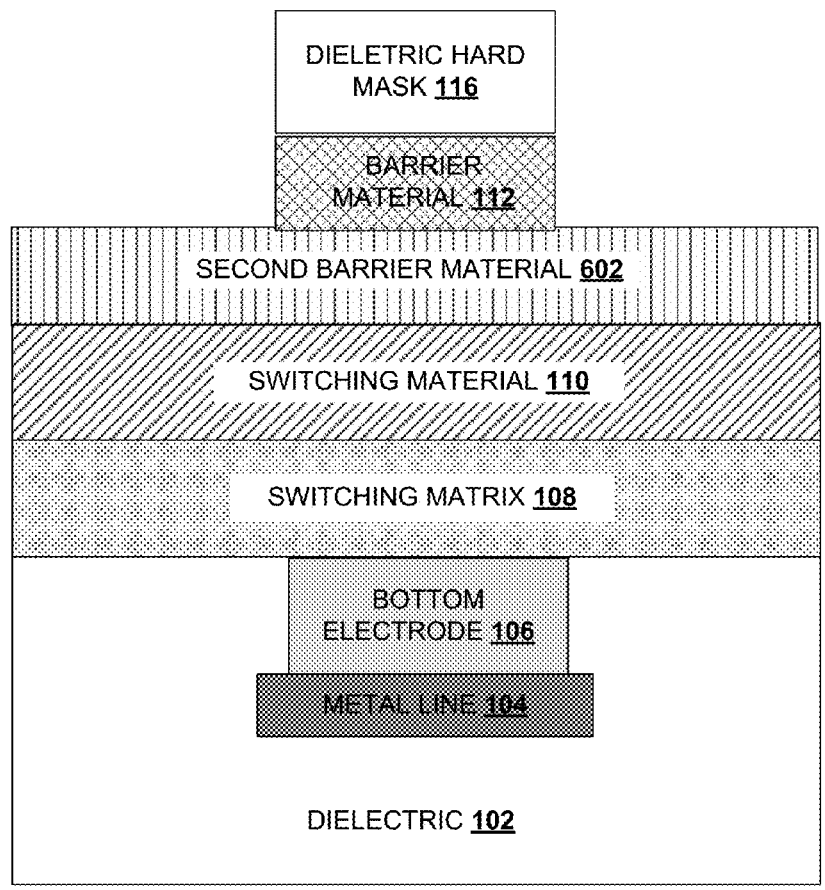
FIG. 9 illustrates a cross sectional view of another multilayer structure that is an intermediate state of a portion of an exemplary memory device, in accordance with the second embodiment.

FIG. 9 illustrates another cross sectional view of a multilayer structure 900 that is an intermediate state of a portion of an exemplary memory device (e.g., a RRAM device). Structure 900 depicts processed structure 800 following the second etching step/process in accordance with aspects and embodiments disclosed herein. As seen in structure 900, a portion of the barrier material 112 present in structure 800 has been removed. Etching of barrier material 112 with respect to structure 900 can proceed in as same or similar manner described regarding the second etch process of structure 400. However, according to this embodiment, when etching barrier material 112, second barrier metal 602 can serve as a stopping layer. Accordingly, an etchant employed to etch barrier material 112 can preferentially etch barrier material 112 over barrier material 602. Similarly, post second etch cleaning can be applied to structure 900 in a same or similar manner to that described with respect to structure 400. Repetitive description of like elements employed in respective embodiments of processes and devices described herein is omitted for sake of brevity.

Figure 10:
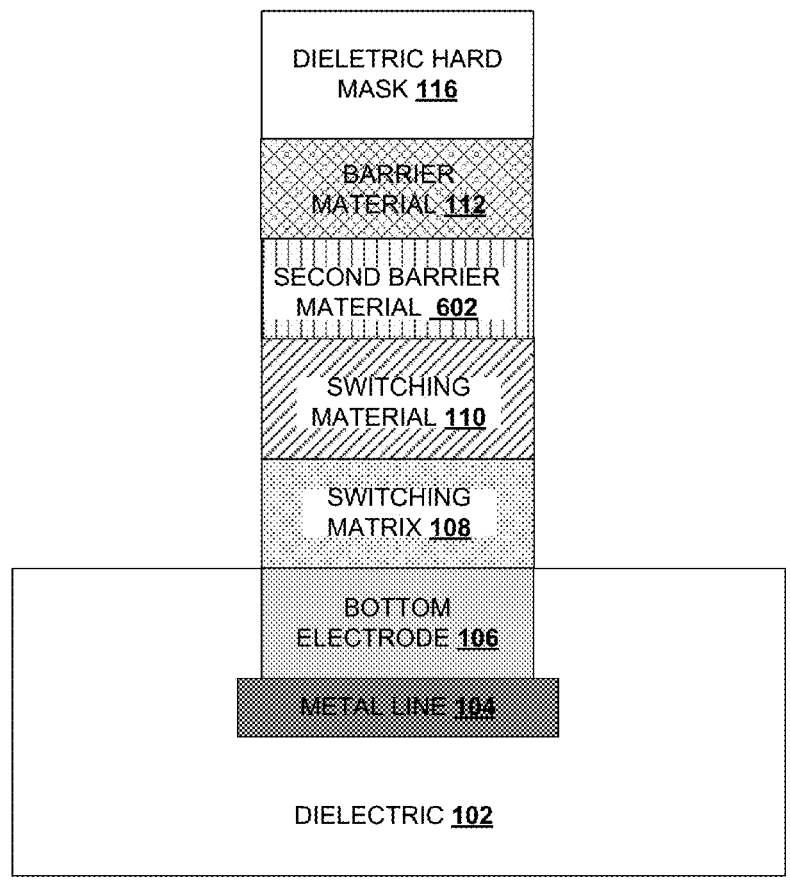
FIG. 10 illustrates a cross sectional view of another multilayer structure that is an intermediate state of a portion of an exemplary memory device, in accordance with the second embodiment.

FIG. 10 illustrates another cross sectional view of a multilayer structure 1000 that is an intermediate state of a portion of an exemplary memory device (e.g., a RRAM device). Structure 1000 depicts processed structure 900 following the third etching step/process in accordance with aspects and embodiments disclosed herein. As seen in structure 1000, a portion of the barrier material 602, conductive material 110 and switching matrix present in structure 900 have been removed. Etching of the conductive material 110 and switching matrix 108 with respect to structure 1000 can proceed in as same or similar manner described regarding the third etch process of structure 500. However, according to this embodiment, the second barrier material can be etched along with the conductive material 110 and switching matrix 108 during the third etching step (e.g., using ion milling). Similarly, post third etch cleaning can be applied to structure 1000 in a same or similar manner to that described with respect to structure 500. Repetitive description of like elements employed in respective embodiments of processes and devices described herein is omitted for sake of brevity.

In various embodiments, memory cell 500 or memory cell 1000 can comprise one or more other layers (not depicted). For instance, an intermediary layer(s) can be instituted adjacent to one or more layers depicted by memory cell 500 or memory cell 1000. As one example, a suitable material that mitigates or controls unintended oxidation can be situated adjacent to or between one or more other layers depicted by memory cell 500 or memory cell 1000. As another example, memory cell 500 or memory cell 1000 can have fewer layers than depicted or described above. Accordingly, it is to be appreciated that suitable variations of memory cell 500 or memory cell 1000 known in the art or made known to one of ordinary skill in the art by way of the context provided herein are considered within the scope of the present disclosure.

The aforementioned diagrams have been described with respect to interaction between several components (e.g., layers) of a memory cell, or memory architectures comprised of such memory cells. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. Additionally, it is noted that one or more disclosed processes can be combined into a single process providing aggregate functionality. For instance, a program process can comprise a read process, or vice versa, to facilitate programming and reading a semiconductor cell by way of a single process. In addition, it should be appreciated that components of the disclosed architectures can also interact with one or more other components not specifically described herein but known by those of skill in the art.

Figure 11:
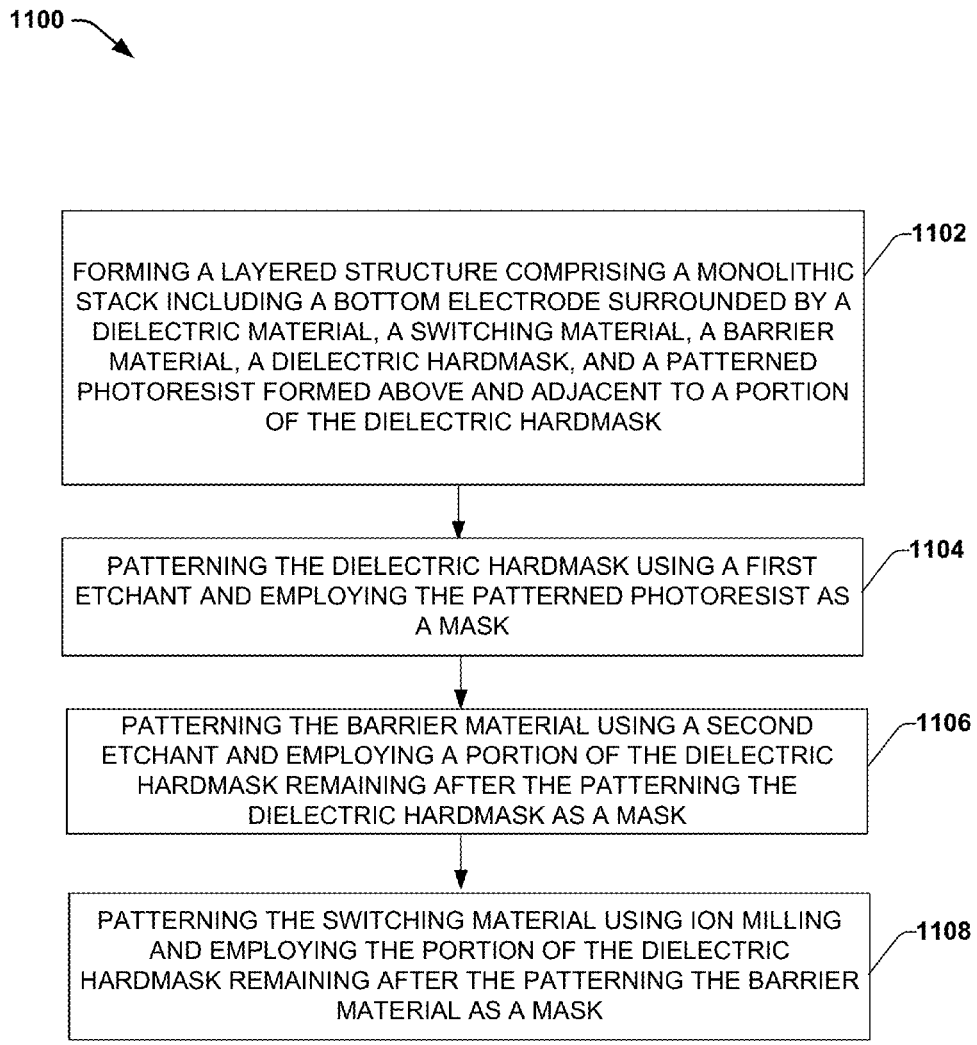
FIG. 11 illustrates a flow diagram of an example method for forming a RRAM cell in accordance with various aspects and embodiments.
Figure 12:
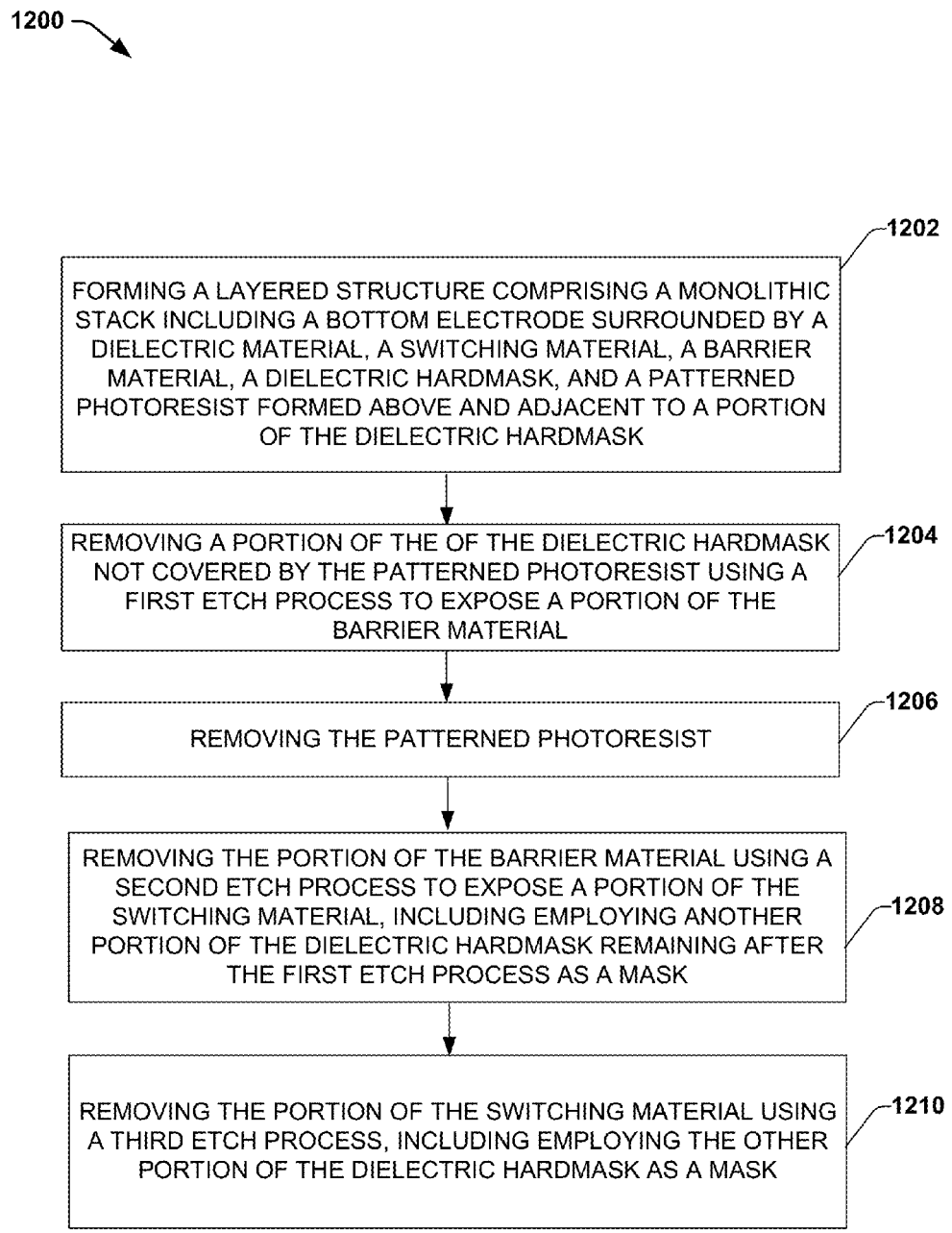
FIG. 12 illustrates a flow diagram of another example method for forming a RRAM cell in accordance with various aspects and embodiments.
Figure 13:
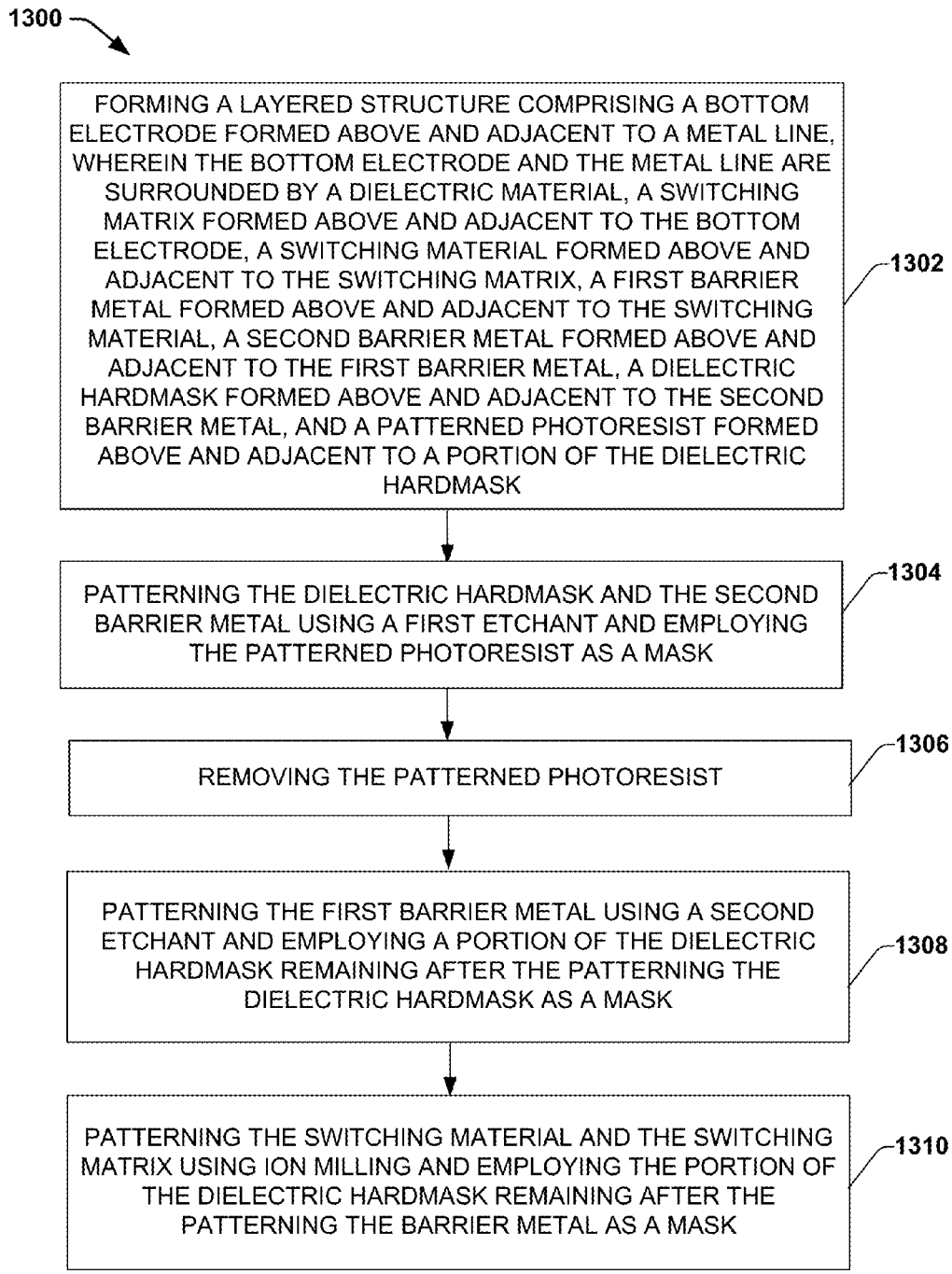
FIG. 13 illustrates a flow diagram of another example method for forming a RRAM cell in accordance with various aspects and embodiments.

In view of the exemplary diagrams described supra, process methods that can be implemented in accordance with the disclosed subject matter will be better appreciated with reference to the flow chart of FIGS. 11-13. While for purposes of simplicity of explanation, the method of FIGS. 11-13 is shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 11 depicts a flowchart of an example method 1100 for forming a RRAM device in accordance with aspects and embodiments disclosed herein. Method 1100 involves patterning a RRAM switching matrix and material utilizing ion mill etching to define a memory cell. At 1102, a layered structure is formed comprising a monolithic stack including a bottom electrode surrounded by a dielectric material, a switching material, a barrier material, a dielectric hardmask, and a patterned photoresist formed above and adjacent to a portion of the dielectric hardmask. The layered structure can further include a switching matrix adjacent to the switching material. In an aspect, the layered structure is formed by depositing the switching matrix and switching material onto the bottom electrode. The switching matrix is selected from a group of non-stoichiometric compounds consisting of: SiOx, TiOx, amorphous Si, AlOx, HfOx, NiOx, TaOx, NbOx, ZnOx, ZrOx, GdOx, wherein X is a non-stoichiometric positive number, and the switching material comprises at least one of: Pd, Ag, Pt, Au, Cu, Ir, Ru, Al, TiN, Ti, or W. The barrier metal is then deposited over the switching matrix and switching material and the dielectric hardmask is deposited over the barrier metal. The barrier metal can include TiN, Ti, W, or TaN, and the dielectric hardmask can include SiO2, SiN, SiC, or amorphous carbon.

The layered structure is subsequently patterned using photo resist patterning to define a RRAM memory cell. In particular, at 1104 the dielectric hardmask is patterned using a first etchant and employing the patterned photoresist as a mask. After the dielectric hardmask is etched, the patterned photoresist can be removed and the layered structure can be cleaned (e.g., using ashing or solvent strip). At 1106, the barrier material is patterned using a second etchant and employing a portion of the dielectric hardmask remaining after the patterning the dielectric hardmask as a mask. In an aspect, the dielectric hardmask is utilized to remove a portion of the barrier metal using a plasma etch. Then at 1108, the switching material is patterned using ion milling or etching and employing the portion of the dielectric hardmask remaining after the patterning the barrier material as a mask. For example, ion milling using Ar, Kr, or Xe can be employed to remove the switching material (and switching matrix) using the dielectric hardmask for patterning.

In an aspect, the dielectric hardmask plasma etch of step 1104 removes 100-500 nm of the dielectric hardmask with a barrier metal selectivity of >10:1. In addition, ashing and cleaning of the dielectric hardmask photoresist can be performed prior to step 1106 such that less than 20 nm of barrier metal is removed. In an aspect, the barrier metal prevents diffusion and interaction of the switching material and prevents RRAM plasma damage and exposure to atmosphere and halogens from etches. The barrier metal can also provide a stop layer for post etch CMP.

In an aspect, the barrier metal plasma etch of step 1106 removes 50-150 nm of the barrier metal with minimal dielectric hardmask loss (e.g., a dielectric hardmask loss of about 10-20 nm). As previously noted, the dielectric hardmask is used to pattern the RRAM cell during ion milling. Because the patterned photoresist is removed before performance of ion milling so no polymers are generated, thus providing for post etch cleaning following step 1108 that does not require ashing (only solvent strip).

In an aspect, the ion milling of step 1108 utilizes a neutralized beam, thus minimizing or preventing electrical damage to the RRAM cell. Further, because ion milling with inert gas (Ar, Kr, Xe) doesn't react with the RRAM materials, metal sidewall residues are minimized or eliminated. In addition, the ion milling of step 1108 can employ a low pressure and incident angle of beam to minimize the redeposition of material on sidewalls. For example, the ion mill pressure can be about $1.0E^5$-$1.0E^{-3}$ Torr, to facilitate reasonable PRAM material removal while minimizing redeposition of material on sidewalls. In an aspect, the ion mill beam power density is also low (range 0.1-10 mA/cm2) and the layered stack is cooled in water to further minimize and prevent migration of RRAM materials.

FIG. 12 depicts a flowchart of another example method 1200 for forming a RRAM device in accordance with aspects and embodiments disclosed herein. At 1102, a layered structure is formed comprising a monolithic stack including a bottom electrode surrounded by a dielectric material, a switching material, a barrier material, a dielectric hardmask, and a patterned photoresist formed above and adjacent to a portion of the dielectric hardmask. The layered structures is subsequently patterned using a three etch step process.

In particular, at 1204 a portion of the dielectric hardmask not covered by the patterned photoresist is removed using a first etch process to expose a portion of the barrier material. At 1206, the patterned photoresist is then removed. At 1208, the portion of the barrier material is then removed using a second etch process to expose a portion of the switching material, including employing another portion of the dielectric hardmask remaining after the first etch process as a mask. Then at 1210, the portion of the switching material (and a portion of the switching matrix below and adjacent to the portion of the switching material) is removed using a third etch process, including employing the other portion of the dielectric hardmask as a mask.

FIG. 13 depicts a flowchart of another example method 1300 for forming a RRAM device in accordance with aspects and embodiments disclosed herein. At 1302, a layered structure is formed that includes a bottom electrode formed above and adjacent to a metal line, wherein the bottom electrode and the metal line are surrounded by a dielectric material, a switching matrix formed above and adjacent to the bottom electrode, a switching material formed above and adjacent to the switching matrix, a first barrier material formed above and adjacent to the switching material, a second barrier material formed above and adjacent to the first barrier material, a dielectric hardmask formed above and adjacent to the second barrier material, and a patterned photoresist formed above and adjacent to a portion of the dielectric hardmask. The layered structures is subsequently patterned using a three etch step process.

In particular, at 1304, the dielectric hardmask and the second barrier material are patterned using a first etchant and employing the patterned photoresist as a mask. At 1306, the patterned photoresist is removed. At 1308 the first barrier material is patterned using a second etchant and employing a portion of the dielectric hardmask remaining after the patterning the dielectric hardmask as a mask. Thank at 1310, the switching material and the switching matrix are patterned using ion milling or etching and employing the portion of the dielectric hardmask remaining after the patterning the barrier material as a mask.

Although not shown in FIGS. 11-13, the methodologies can include any suitable memory device fabrication processes. General examples of memory device fabrication processes include masking, patterning, etching, cleaning, planarization, thermal oxidation, implant, annealing, thermal treatment, and deposition techniques normally used for making memory devices.

The resultant memory device formed herein can be employed for central processing units (CPUs); volatile memory devices such as DRAM devices, SRAM devices, and the like; input/output devices (I/O chips); and non-volatile memory devices such as EEPROMs, EPROMs, PROMs, and the like. The resultant memory device formed herein is useful in any electronic device. For example, the resultant memory device is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

Figure 14:
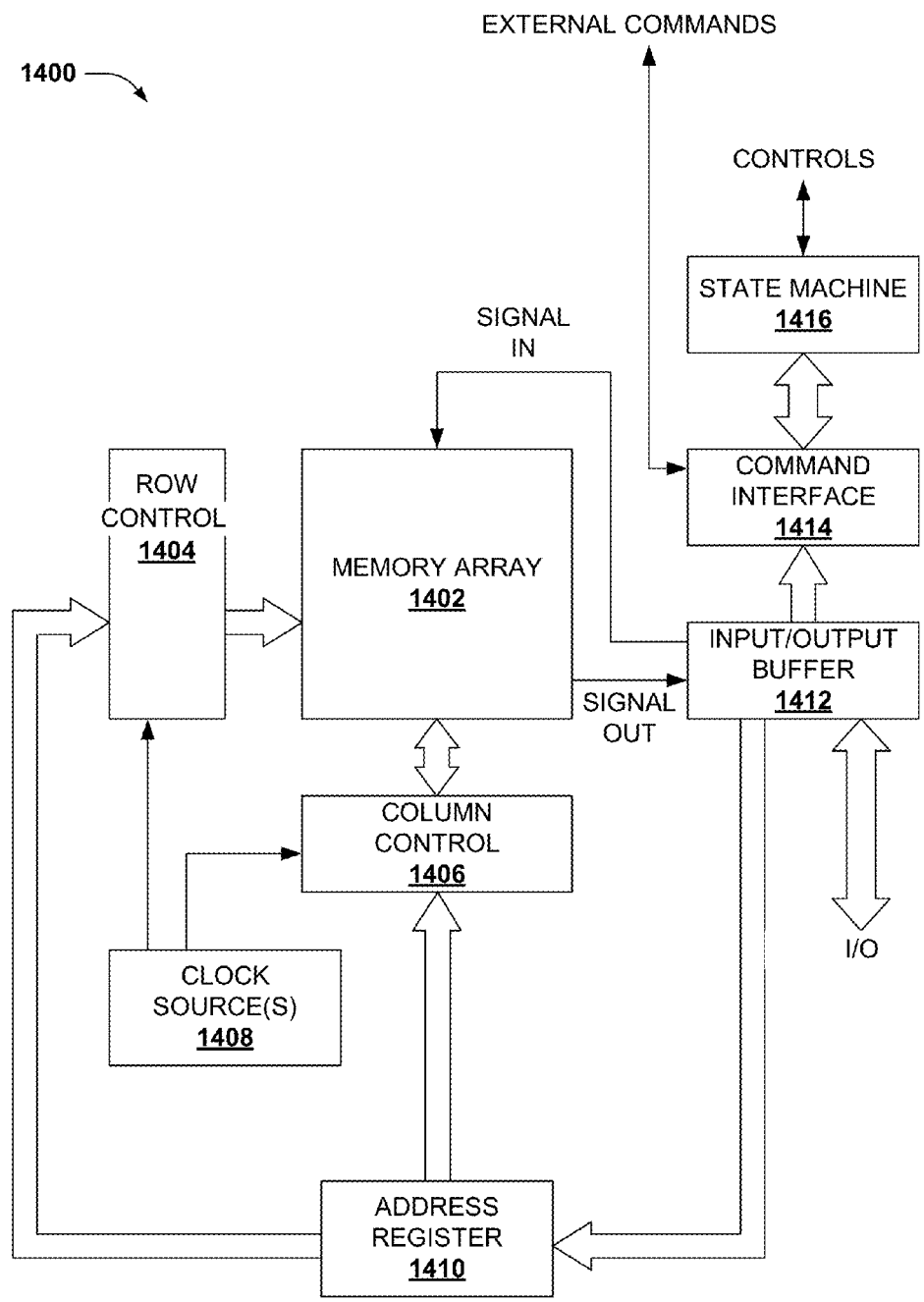
FIG. 14 depicts a block diagram of a sample operating environment for facilitating implementation of one or more disclosed embodiments.
Figure 15:
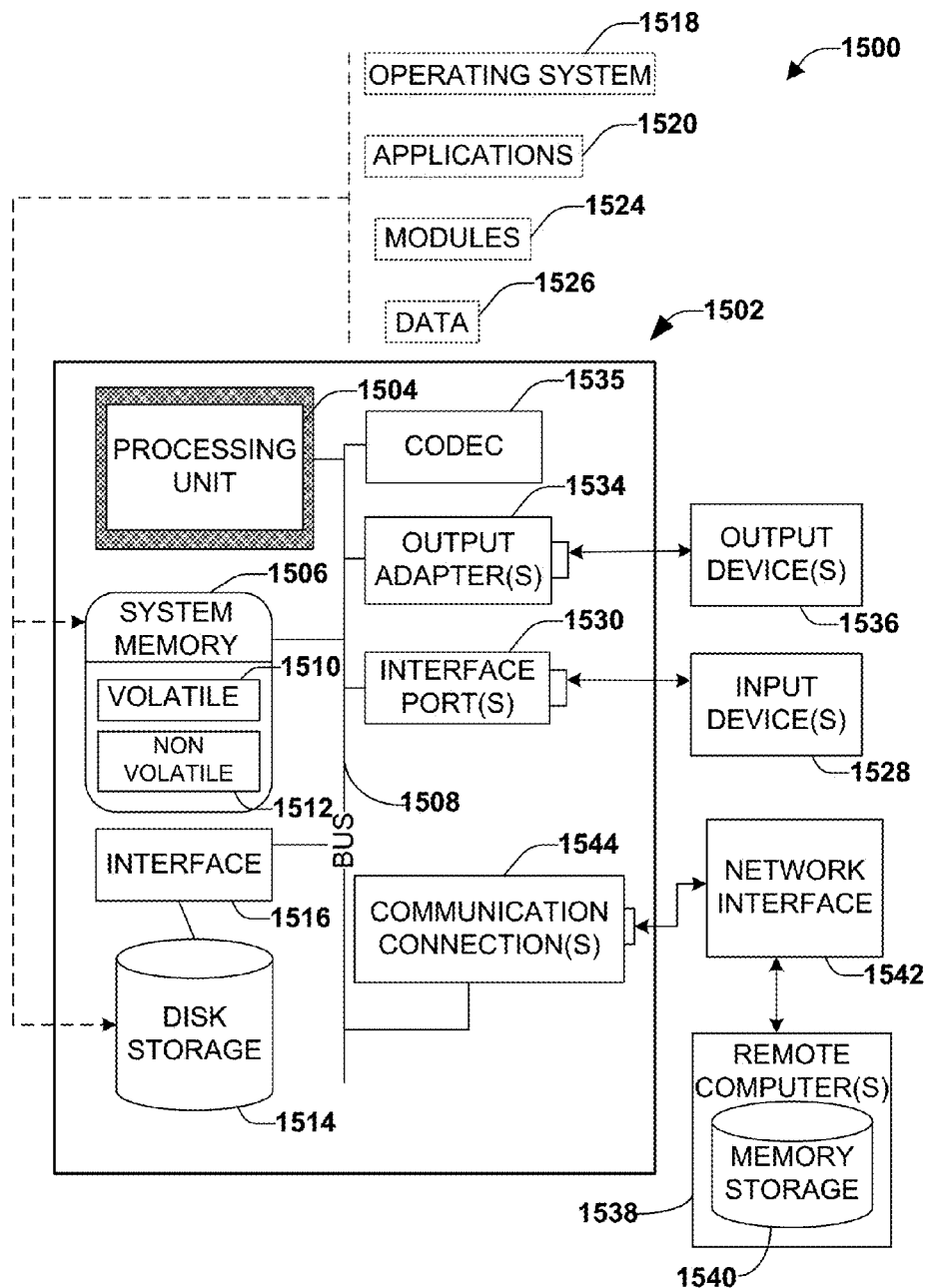
FIG. 15 illustrates a block diagram of an example computing environment that can be implemented in conjunction with various embodiments.

In order to provide a context for the various aspects of the disclosed subject matter, FIGS. 14-15, as well as the following discussion, is intended to provide a brief, general description of a suitable environment in which various aspects of the disclosed subject matter can be implemented or processed. While the subject matter has been described above in the general context of electronic memory and process methodologies for fabricating and operating such electronic memory or components/layers thereof, those skilled in the art will recognize that the subject disclosure also can be implemented in combination with other electronic memory technologies, memory architectures or process methodologies. Moreover, those skilled in the art will appreciate that the disclosed processes can be practiced with a processing system or a computer processor, either alone or in conjunction with a host computer (e.g., computer 1002 of FIG. 10, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

In addition to the foregoing, in various disclosed embodiments, disclosed memory devices or components thereof can be employed as a standalone or integrated embedded memory device with a CPU or microcomputer (or, e.g., a nanocomputer, and so forth). Some embodiments can be implemented as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact Flash (CF) card, or the like, or a suitable combination of the foregoing.

NAND Flash is employed for compact Flash devices, USB devices, SD cards, solid state drives (SSDs), and storage class memory, as well as other form-factors. Although NAND has proven a successful technology in fueling the drive to scale down to smaller devices and higher chip densities over the past decade, as technology has scaled down past 25 nm memory cell technology, several structural, performance, and reliability problems became evident to the inventors of the present disclosure. Accordingly, various aspects of the present disclosure are provided to address some or all of these considerations.

FIG. 14 illustrates a block diagram of an example operating and control environment 1400 for a memory cell array 1402 according to aspects of the subject disclosure. In at least one aspect of the subject disclosure, memory cell array 1402 can comprise a variety of memory cell technology (e.g., resistive switching memory cell technology). Particularly, memory cell array can comprise resistive switching memory cells having relatively smooth SiGe thin films, as described herein.

A column controller 1406 can be formed adjacent to memory cell array 1402. Moreover, column controller 1406 can be electrically coupled with bit lines of memory cell array 1402. Column controller 1406 can control respective bitlines, applying suitable program, erase or read voltages to selected bitlines.

In addition, operating and control environment 1400 can comprise a row controller 1404. Row controller 1404 can be formed adjacent to column controller 1406, and electrically connected with word lines of memory cell array 1402. Row controller 1404 can select particular rows of memory cells with a suitable selection voltage. Moreover, row controller 1404 can facilitate program, erase or read operations by applying suitable voltages at selected word lines.

A clock source(s) 1408 can provide respective clock pulses to facilitate timing for read, write, and program operations of row control 1404 and column control 1406. Clock source(s) 1408 can further facilitate selection of word lines or bit lines in response to external or internal commands received by operating and control environment 1400. An input/output buffer 1412 can be connected to an external host apparatus, such as a computer or other processing device (not depicted, but see e.g., computer 1202 of FIG. 12, infra) by way of an I/O buffer or other I/O communication interface. Input/output buffer 1412 can be configured to receive write data, receive an erase instruction, output readout data, and receive address data and command data, as well as address data for respective instructions. Address data can be transferred to row controller 1404 and column controller 1406 by an address register 1410. In addition, input data is transmitted to memory cell array 1402 via signal input lines, and output data is received from memory cell array 1402 via signal output lines. Input data can be received from the host apparatus, and output data can be delivered to the host apparatus via the I/O buffer.

Commands received from the host apparatus can be provided to a command interface 1414. Command interface 1414 can be configured to receive external control signals from the host apparatus, and determine whether data input to the input/output buffer 1412 is write data, a command, or an address. Input commands can be transferred to a state machine 1416.

State machine 1416 can be configured to manage programming and reprogramming of memory cell array 1402. State machine 1416 receives commands from the host apparatus via input/output interface 1412 and command interface 1414, and manages read, write, erase, data input, data output, and like functionality associated with memory cell array 1402. In some aspects, state machine 1416 can send and receive acknowledgments and negative acknowledgments regarding successful receipt or execution of various commands.

To implement read, write, erase, input, output, etc., functionality, state machine 1416 can control clock source(s) 1408. Control of clock source(s) 1408 can cause output pulses configured to facilitate row controller 1404 and column controller 1406 implementing the particular functionality. Output pulses can be transferred to selected bit lines by column controller 1406, for instance, or word lines by row controller 1404, for instance.

In connection with FIG. 15, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 15, a suitable environment 1500 for implementing various aspects of the claimed subject matter includes a computer 1502. The computer 1502 includes a processing unit 1504, a system memory 1506, a codec 1535, and a system bus 1508. The system bus 1508 couples system components including, but not limited to, the system memory 1506 to the processing unit 1504. The processing unit 1504 can be any of various available processors. Dual microprocessors and other multiprocessor architectures also can be employed as the processing unit 1504.

The system bus 1508 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1506 includes volatile memory 1510 and non-volatile memory 1512, which can employ one or more of the disclosed memory architectures, in various embodiments. The basic input/output system (BIOS), containing the basic routines to transfer information between elements within the computer 1502, such as during start-up, is stored in non-volatile memory 1512. In addition, according to the present disclosure, codec 1535 may include at least one of an encoder or decoder, wherein the at least one of an encoder or decoder may consist of hardware, software, or a combination of hardware and software. Although codec 1535 is depicted as a separate component, codec 1535 may be contained within non-volatile memory 1512. By way of illustration, and not limitation, non-volatile memory 1512 can include read only memory (ROM), programmable ROM (PROM), electrically programmable ROM (EPROM), electrically erasable programmable ROM (EEPROM), or Flash memory. Non-volatile memory 1512 can employ one or more of the disclosed memory architectures, in at least some disclosed embodiments. Moreover, non-volatile memory 1512 can be computer memory (e.g., physically integrated with computer 1502 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1510 includes cache memory, or random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1502 may also include removable/non-removable, volatile/non-volatile computer storage medium. FIG. 15 illustrates, for example, disk storage 1514. Disk storage 1514 includes, but is not limited to, devices like a magnetic disk drive, solid state disk (SSD) floppy disk drive, tape drive, Jaz drive, Zip drive, LS-150 drive, flash memory card, or memory stick. In addition, disk storage 1514 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1514 to the system bus 1508, a removable or non-removable interface is typically used, such as interface 1516. It is appreciated that storage devices 1514 can store information related to a user. Such information might be stored at or provided to a server or to an application running on a user device. In one embodiment, the user can be notified (e.g., by way of output device(s) 1536) of the types of information that are stored to disk storage 1514 and/or transmitted to the server or application. The user can be provided the opportunity to opt-in or opt-out of having such information collected and/or shared with the server or application (e.g., by way of input from input device(s) 1528).

It is to be appreciated that FIG. 15 describes software that acts as an intermediary between users and the basic computer resources described in the suitable operating environment 1500. Such software includes an operating system 1518. Operating system 1518, which can be stored on disk storage 1514, acts to control and allocate resources of the computer system 1502. Applications 1520 take advantage of the management of resources by operating system 1518 through program modules 1524, and program data 1526, such as the boot/shutdown transaction table and the like, stored either in system memory 1506 or on disk storage 1514. It is to be appreciated that the claimed subject matter can be implemented with various operating systems or combinations of operating systems.

A user enters commands or information into the computer 1502 through input device(s) 1528. Input devices 1528 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1504 through the system bus 1508 via interface port(s) 1530. Interface port(s) 1530 include, for example, a serial port, a parallel port, a game port, and a universal serial bus (USB). Output device(s) 1536 use some of the same type of ports as input device(s) 1528. Thus, for example, a USB port may be used to provide input to computer 1502 and to output information from computer 1502 to an output device 1536. Output adapter 1534 is provided to illustrate that there are some output devices 1536 like monitors, speakers, and printers, among other output devices 1536, which require special adapters. The output adapters 1534 include, by way of illustration and not limitation, video and sound cards that provide a means of connection between the output device 1536 and the system bus 1508. It should be noted that other devices and/or systems of devices provide both input and output capabilities such as remote computer(s) 1538.

Computer 1502 can operate in a networked environment using logical connections to one or more remote computers, such as remote computer(s) 1538. The remote computer(s) 1538 can be a personal computer, a server, a router, a network PC, a workstation, a microprocessor based appliance, a peer device, a smart phone, a tablet, or other network node, and typically includes many of the elements described relative to computer 1502. For purposes of brevity, only a memory storage device 1540 is illustrated with remote computer(s) 1538. Remote computer(s) 1538 is logically connected to computer 1502 through a network interface 1542 and then connected via communication connection(s) 1544. Network interface 1542 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1544 refers to the hardware/software employed to connect the network interface 1542 to the bus 1508. While communication connection 1544 is shown for illustrative clarity inside computer 1502, it can also be external to computer 1502. The hardware/software necessary for connection to the network interface 1542 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method, comprising:
   forming a layered structure comprising a bottom electrode formed within a dielectric material, a switching material, a barrier material, a dielectric hardmask, and a patterned photoresist formed above and adjacent to a portion of the dielectric hardmask;
   patterning the dielectric hardmask to form a patterned dielectric hardmask using a first plasma-phase etchant and the patterned photoresist as a mask for the patterned dielectric hardmask;
   patterning the barrier material to form a patterned barrier material layer using a second plasma-phase etchant and the patterned dielectric hardmask as a second mask for the patterned barrier material, wherein the first plasma-phase etchant and the second plasma-phase etchant have a different etch selectivity for the dielectric hardmask and the barrier material, respectively; and
   patterning the switching material using ion milling and the patterned dielectric hardmask as a third mask for a patterned switching material.

2. The method of claim 1, further comprising:
   removing the patterned photoresist after the patterning the dielectric hardmask and before the patterning the barrier material.

3. The method of claim 1, wherein the layered structure further comprises a switching matrix formed between the bottom electrode and the switching material, the method further comprising:
   patterning the switching matrix using the ion milling and using the patterned dielectric hardmask to mask the switching matrix.

4. The method of claim 3, wherein the switching matrix is selected from a group consisting of: $SiO_x$, $TiO_x$, amorphous Si, $AlO_x$, $HfO_x$, $NiO_x$, $TaO_x$, $NbO_x$, $ZnO_x$, $ZrO_x$, and $GdO_x$, wherein X is a positive number, and further wherein the switching material comprises at least one of: Pd, Ag, Pt, Au, Cu, Ir, Ru, Al, TiN, Ti, or W.

5. The method of claim 1, wherein the barrier material is selected from a group consisting of: TiN, Ti, W, and TaN.

6. The method of claim 1, wherein the dielectric hardmask is selected from a group consisting of: SiO2, SiN, SiC, and amorphous carbon.

7. The method of claim 1, wherein the ion milling comprises employing at least one of inert gas selected from a group consisting of: Ar, Kr, and Xe.

8. The method of claim 1, further comprising:
   cooling the switching material to less than 100° C. prior to the patterning the switching material using the ion milling.

9. The method of claim 8, wherein the ion milling comprises utilizing a beam power density from about 0.1 to about 10.0 mA/cm2 at a pressure of about 1.0 E-5 to about 1.0E-3 Torr.

10. A method, comprising:
    forming a layered structure comprising a bottom electrode surrounded by a dielectric material, a switching material, a barrier material, a dielectric hardmask, and a patterned photoresist formed above and adjacent to a portion of the dielectric hardmask; and
    patterning the layered structure to form a memory cell, wherein the patterning comprises sequentially:
       removing a portion of the dielectric hardmask not covered by the patterned photoresist using a first plasma-phase etchant to expose a portion of the barrier material;
       removing the patterned photoresist;
       removing the portion of the barrier material using a second plasma-phase etchant to expose a portion of the switching material, wherein the first plasma-phase etchant and the second plasma-phase etchant have a different etch selectivity for the dielectric hardmask and the barrier material, respectively; and
       removing the portion of the switching material using ion milling.

11. The method of claim 10, wherein the removing the portion of the barrier material and the removing the portion of the switching material comprises employing a second portion of the dielectric hardmask remaining after the removing the first portion as a mask for the switching material.

12. The method of claim 10, wherein the removing the patterned photoresist comprises employing ashing and wet chemical cleaning.

13. The method of claim 10, wherein the second plasma-phase etchant has an etch selectivity for the barrier material over the dielectric hardmask or the switching material at about 10:1.

14. The method of claim 10, wherein the layered structure further comprises a switching matrix formed between the bottom electrode and the switching material, the method further comprising:
    removing a portion of the switching matrix using the ion milling.

15. The method of claim 14,
    wherein the switching matrix is selected from a group consisting of: $SiO_x$, $TiO_x$, amorphous Si, $AlO_x$, $HfO_x$, $NiO_x$, $TaO_x$, $NbO_x$, $ZnO_x$, $ZrO_x$, and $GdO_x$, wherein X is a positive number, and
    wherein the switching material is selected from a second group consisting of: Pd, Ag, Pt, Au, Cu, Ir, Ru, Al, TiN, Ti, and W.

16. The method of claim 10, wherein the barrier material comprises at least one of: TiN, Ti, W, or TaN, and wherein the dielectric hardmask comprises at least one of: $SiO_2$, SiN, SiC, or amorphous carbon.

17. The method of claim 10, wherein the ion milling comprises employing at least one of inert gas Ar, Kr, or Xe.

18. The method of claim 10, wherein the ion milling comprises utilizing a beam power density from about 0.1 to about 10.0 mA/cm2 at a pressure of about 1.0 E-5 to about 1.0E-3 Torr.

19. A method for forming a memory cell, comprising:
    etching a portion of a dielectric hardmask layer of a monolithic stack structure using a first plasma etchant, resulting in formation of a patterned dielectric hardmask layer formed on a barrier material layer, wherein the monolithic stack structure comprises:
       a bottom electrode,
       a switching material layer formed over the bottom electrode,
       the barrier material layer formed over the switching material layer, and the dielectric hardmask layer formed over the barrier material layer;

etching a portion of the barrier material layer using a second plasma etchant, resulting in formation of a patterned barrier material layer formed on the switching material layer, wherein the first plasma etchant and the second plasma etchant have a different etch selectivity for the dielectric hardmask layer and the barrier material layer, respectively; and etching a portion of the switching material layer to form a patterned switching material layer using ion milling.

20. The method of claim 19, wherein the etching the portion of the barrier layer and the etching the portion of the switching material layer comprises employing the patterned dielectric hardmask layer as a mask.

* * * * *